United States Patent
Takashima et al.

[11] Patent Number: 6,166,433
[45] Date of Patent: Dec. 26, 2000

[54] RESIN MOLDED SEMICONDUCTOR DEVICE AND METHOD OF MANUFACTURING SEMICONDUCTOR PACKAGE

[75] Inventors: Akira Takashima; Hidehiko Akasaki; Haruo Kojima; Fumihiko Taniguchi; Kazunari Kosakai, all of Kawasaki; Koji Honna, Aizuwakamatsu; Toshihisa Higashiyama, Kasugai, all of Japan

[73] Assignee: Fujitsu Limited, Kawasaki, Japan

[21] Appl. No.: 09/220,351

[22] Filed: Dec. 24, 1998

[30] Foreign Application Priority Data

| Mar. 26, 1998 | [JP] | Japan | 10-079812 |
| Oct. 30, 1998 | [JP] | Japan | 10-310877 |
| Nov. 18, 1998 | [JP] | Japan | 10-328386 |

[51] Int. Cl.⁷ .......................... H01L 23/48; H01L 23/14; H01L 23/28
[52] U.S. Cl. .......................... 257/702; 257/787; 257/788; 257/794; 257/693; 257/783; 257/778
[58] Field of Search .................... 257/702, 787, 257/788, 794, 693, 783, 778, 678

[56] References Cited

U.S. PATENT DOCUMENTS

| 5,355,019 | 10/1994 | Fuchs | 257/702 |
| 5,371,404 | 12/1994 | Juskey et al. | 257/778 |
| 5,535,101 | 7/1996 | Miles et al. | 257/787 |
| 5,932,345 | 8/1999 | Furutani et al. | 428/364 |
| 5,953,592 | 11/1999 | Taniguchi et al. | 438/118 |
| 5,973,337 | 10/1999 | Knapp et al. | 257/780 |
| 5,985,695 | 11/1999 | Freyman et al. | 438/112 |
| 5,990,545 | 11/1999 | Schueller et al. | 257/697 |

FOREIGN PATENT DOCUMENTS

| 57-97634 | 6/1982 | Japan | 257/783 |
| 5-41409 | 2/1993 | Japan | 257/783 |
| 5-67705 | 3/1993 | Japan . | |
| 8-92352 | 4/1996 | Japan . | |
| 8-316374 | 11/1996 | Japan . | |

Primary Examiner—David Hardy
Assistant Examiner—Jhihan B Clark
Attorney, Agent, or Firm—Armstrong,Westerman, Hattori, McLeland & Naughton

[57] ABSTRACT

The semiconductor device includes a semiconductor chip, an FPC tape for mounting the semiconductor chip thereto, a mold resin for protecting the semiconductor chip, and metal balls provided on the FPC tape for connecting the semiconductor chip to a circuit board. The mold resin has the glass transition temperature not lower than 200° C., the coefficient of linear expansion in the range from 13 to 18 ppm/° C., and Young's modulus in the range from 1500 to 3000 kg/mm², whereby warpage of the semiconductor device is mitigated. The semiconductor device can also include a buffer layer. The semiconductor device can be manufactured by collectively molding a plurality of semiconductor chips mounted to the FPC tape and by cutting the molded article into individual semiconductor packages.

16 Claims, 26 Drawing Sheets

RESIN MOLDED SEMICONDUCTOR DEVICE AND METHOD OF MANUFACTURING SEMICONDUCTOR PACKAGE

BACKGROUND OF THE INVENTION

1. Field of the Invention

The present invention relates to a semiconductor device having a semiconductor chip, an FPC tape for mounting the semiconductor chip thereto, a mold resin for protecting the semiconductor chip, and metal balls provided on the FPC tape for connecting the semiconductor chip to a circuit board. Further, the present invention relates to a method of manufacturing a semiconductor package.

2. Description of the Related Art

In recent years, user's demands for high-density packaging have resulted in the size reduction of semiconductor packages. There has been known a semiconductor package adapted so that semiconductor chips are mounted to an FPC tape such as a TAB tape and protected by a mold resin so as to meet such demands. Further, there has been developed a semiconductor package called "tape BGA", in which metal balls such as solder balls are provided on a FPC tape. The semiconductor package can be mechanically and electrically connected to a circuit board by the metal balls.

In the case where a warped semiconductor package is mounted to a printed circuit board, the space between the semiconductor package and the printed circuit board is nonuniform, with the result that some of the metal balls may not have sufficient contact with the printed circuit board. This decreases the reliability of connection between the semiconductor package and the printed circuit board. The cause of an occurrence of warpage in the semiconductor package is the difference in coefficient of linear expansion between the mold resin and the semiconductor chip. Thus, to prevent warpage from occurring in the semiconductor package, an attempt has been made to make the coefficient of linear expansion of the mold resin close to that of linear expansion of the semiconductor chip by reducing the linear expansion of the mold resin. For example, the coefficient of linear expansion of the semiconductor chip is about 4 ppm/° C. Thus, the coefficient of linear expansion of the mold resin is set at, for instance, 8 ppm/° C. so as to bring the linear expansion of the mold resin close to that of linear expansion of the semiconductor chip.

Moreover, an attempt has been made to prevent an occurrence of warpage in the semiconductor package by increasing the glass transition temperature of the mold resin. Japanese Unexamined Patent Publication (Kokai) No. 5-67705 discloses that the glass transition temperature of the mold resin should be not lower than 180° C., which is the forming temperature thereof, and the coefficient of linear expansion thereof should be not more than 16 ppm/° C. so as to prevent an occurrence of warpage in the semiconductor package. Japanese Unexamined Patent Publication (Kokai) No. 8-92352 discloses that the glass transition temperature of the mold resin should be not lower than 180° C., that the coefficient of linear expansion thereof should be not more than 16 ppm/° C. and that the coefficient of elasticity thereof should be 1400 kgf /mm² so as to prevent an occurrence of warpage in the semiconductor package.

As a result of bringing the coefficient of linear expansion of the mold resin close to that of the semiconductor chip so as to prevent an occurrence of warpage of the semiconductor package, the warpage of the semiconductor package can be reduced, but the difference in coefficient of linear expansion between the mold resin and the printed circuit board to which the semiconductor package should be mounted increases. For instance, the coefficient of linear expansion of the mold resin is 8 ppm/° C., and that of the printed circuit board is 16 ppm/° C. In this case, when the semiconductor package is used by being mounted to the printed circuit board, the metal balls are subjected to stress generated owing to the relative deformation between the semiconductor package and the printed circuit board. Especially, the metal balls placed on the peripheral portion of the semiconductor package are stretched and become liable to break. Consequently, the reliability of connection between the semiconductor package and the printed circuit board is deteriorated.

It is preferable for solving this problem to bring the coefficient of linear expansion of the mold resin close to that of the printed circuit board by increasing the coefficient of linear expansion of the mold resin, in contrast with the case of preventing an occurrence of warpage of the semiconductor package.

According to the techniques described in the aforementioned publications, an occurrence of warpage of the semiconductor package can be prevented by increasing the glass transition temperature of the mold resin. However, even in the case of employing these conventional techniques, the glass transition temperature of the mold resin should be not lower than the molding temperature thereof so that the coefficient of linear expansion of the mold resin is prevented from having a large value. Thus, there is a difference in coefficient of linear expansion between the mold resin and the printed circuit board. Consequently, the techniques described in the aforementioned publications have the problem that, when the semiconductor package is mounted to the printed circuit board, the metal balls are subjected to stress generated owing to the relative deformation between the semiconductor package and the printed circuit board and become thin and liable to break.

Further, although the glass transition temperature is not lower than the molding temperature according to such conventional techniques, the actually obtained glass transition temperature is not higher than 200° C. The aforementioned publications describe that, only in one example, the glass transition temperature of the mold resin is 203° C., but the coefficient of linear expansion in this case is 13 ppm/° C. There is no prior art in which the coefficient of linear expansion thereof is not less than 13 ppm/° C. when the glass transition temperature of the mold resin is not lower than 200° C.

Moreover, Japanese Unexamined Patent Publication (Kokai) No. 8-162499 and No. 9-181122 disclose that a semiconductor element and a semiconductor carrier are temporarily fixed by a reinforcing resin in the process of manufacturing the flip chip type semiconductor device, and that an underfill material is inserted between the semiconductor element and the semiconductor carrier after a test is carried out. A space between the semiconductor element and the semiconductor carrier is filled with this underfill material which covers the circumference of the semiconductor element but does not cover the top surface thereof.

As described above, in recent years, user's demands for high-density packaging have resulted in the size reduction of semiconductor packages. There has been known a semiconductor package adapted so that semiconductor chips are mounted to an FPC tape such as a TAB tape and protected by a mold resin so as to meet such demands. Further, there has been developed a semiconductor package called "tape BGA", in which metal balls such as solder balls are provided on a FPC tape. This semiconductor package can be mechanically and electrically connected to a circuit board by the metal balls. Tape BGA having a fine terminal pitch is called "FBGA".

Now, there are demands of the market for a semiconductor package called "CSP" (Chip Size Package). CSP is a semiconductor package in which a mold resin is formed in such a manner as to have almost the same size as that of a semiconductor chip. An FBGA of the CSP type is formed in such a way as to be very small and have high density. Thus, FBGAs have become necessary for manufacturing high-performance electronic devices.

A CSP is manufactured by first mounting semiconductor chips to an FPC tape, and then cutting the FPC tape into pieces each having a size which approximately equals to a package size, and subsequently, putting semiconductor chips mounted to each of the pieces into a molding die, and finally performing resin-molding. The molding die has an upper die and a lower die. A cavity is formed by the upper and lower dies. The internal shape of the cavity is identical with the external shape of the semiconductor package to be manufactured.

Therefore, a cutting device and a molding die, which are suitable for each semiconductor package, are needed for manufacturing a semiconductor package. Namely, there is the necessity for making a cutting device and a molding die suitable for each of different kinds of semiconductor packages. Thus, the CSP requires meeting lead time and costs of such cutting devices and molding dies. Consequently, user's demand that, even if the kind of a semiconductor package to be manufactured is changed, such a semiconductor package can be manufactured without changing the cutting device and the molding die.

Moreover, user's demand that such semiconductor packages are manufactured at low cost.

SUMMARY OF THE INVENTION

The object of the present invention is to provide a semiconductor device in which durability and reliability of metal balls for connecting semiconductor chips to a circuit board are enhanced.

Another object of the present invention is to provide a method of manufacturing a semiconductor package, by which the semiconductor package can be manufactured at low cost by using a general-purpose molding die.

A semiconductor device, according to the present invention, comprises a semiconductor chip, an FPC tape for mounting the semiconductor chip thereto, a mold resin for protecting the semiconductor chip, and metal balls provided on the aforesaid FPC tape for connecting the semiconductor chip to a circuit board. The mold resin has a glass transition temperature not lower than 200° C., a coefficient of linear expansion in the range from 13 to 18 ppm/° C., and Young's modulus in the range from 1500 to 3000 kg/mm².

When the glass transition temperature of the mold resin is not lower than 200° C., the glass transition temperature is sufficiently higher than an ordinary molding temperature. Thus, even if there is variation in the molding conditions, a semiconductor package with small warpage is obtained. Conversely, the glass transition temperature of the mold resin is not higher than 200° C., a semiconductor package with small warpage cannot be sometimes obtained under the influence of the variation in the molding conditions.

A semiconductor package with small warpage can be obtained by setting the glass transition temperature of the mold resin at a value which is not less than 200° C. Thus, even when the coefficient of linear expansion of the mold resin is relatively large, a semiconductor package with small warpage can be obtained. Thus, the coefficient of linear expansion of the mold resin can be brought to be close to that of linear expansion of the printed circuit board on which the semiconductor chip is mounted. Further, stress generated owing to the relative deformation between the semiconductor package and the printed circuit board, which is exerted on the metal balls, becomes small. Consequently, this semiconductor device solves the problem that the metal balls become thin and liable to break. Furthermore, as a result of setting Young's modulus of the mold resin at 1500 to 3000 kg/mm², the mold resin becomes relatively soft and is above to absorb a stress exerted thereon. Consequently, this semiconductor device solves the problem that the metal balls become thin and liable to break.

Preferably, the semiconductor device is a face-up wire-bonding type semiconductor package or a face-down flip chip type semiconductor package.

Further, a semiconductor device according to the present invention comprises a package having a semiconductor chip, an FPC tape for mounting the semiconductor chip thereto, a mold resin for protecting the semiconductor chip, and metal balls provided on the aforesaid FPC tape for connecting the aforesaid semiconductor chip to a circuit board, and a circuit board connected to the semiconductor package by the metal balls. The mold resin has a glass transition temperature not lower than 200° C., a coefficient of linear expansion in the range from 13 to 18 ppm/° C., and Young's modulus in the range from 1500 to 3000 kg/mm². Namely, this semiconductor device is the combination of a semiconductor package having the aforementioned features, and a circuit board to which this semiconductor package is mounted.

Moreover, there is provided a semiconductor device comprising a semiconductor chip, an FPC tape for mounting the semiconductor chip thereto, a mold resin for protecting the semiconductor chip, metal balls provided on the aforesaid FPC tape for connecting the semiconductor chip to a circuit board, and buffer means for buffing stress exerted on the metal balls.

The semiconductor device has buffer means for buffering stress exerted on the metal balls. Thus, in the case that the semiconductor package is used by being mounted to the printed circuit board, even when the metal balls are subjected to stress generated owing to the relative deformation between the semiconductor package and the printed circuit board, such stress is lessened by the buffering means. This can solve the problem that the metal balls become thin and liable to break.

Preferably, the buffer means comprises a buffer layer provided on the surface of the FPC tape to which the semiconductor chip is mounted. Alternatively, it is preferable that the buffer means includes an air layer. Alternatively, it is preferable that the buffer means comprises a buffer layer provided on the surface of the FPC tape, which is opposite to the surface thereof, to which the semiconductor chip is mounted.

Furthermore, there is provided a semiconductor device comprising a semiconductor chip having a top surface and a bottom surface, an FPC tape for mounting the semiconductor chip thereto, an adhesive provided on a partial area of the bottom surface of the semiconductor chip for fixing the bottom surface of the semiconductor chip to the FPC tape, a mold resin for protecting the aforesaid semiconductor chip, and metal balls provided on the FPC tape. The mold resin covers the top surface of the semiconductor chip and is inserted into a space between the bottom surface of the semiconductor chip and the FPC tape.

In this semiconductor device, the mold resin is arranged in such a way as to sandwich the semiconductor chip. Thus, the semiconductor device is hard to warp.

Moreover, according to the present invention, a method for manufacturing a semiconductor package having a semiconductor chip, an FPC tape for mounting the semiconductor chip thereto, a mold resin for protecting the semiconductor chip, and metal balls provided on the FPC tape for connecting the semiconductor chip to a circuit board is provided. The method comprises the steps of mounting a plurality of semiconductor chips to a FPC, collectively molding the semiconductor chips provided on the FPC by using a molding die to thereby form a molded product, and cutting the molded product into individual packages.

According to this method, even when the kind of a semiconductor chip is changed, the semiconductor chip can be manufactured without changing the molding die. Moreover, a resin-molding operation can be performed on a large area (or volume). Consequently, the semiconductor chip can be manufactured at low cost.

Preferably, the step of attaching the metal balls to the FPC tape is performed after the step of molding and before the step of cutting.

Preferably, the mold resin has a glass transition temperature not lower than 200° C., a coefficient of linear expansion in the range from 13 to 18 ppm/° C., and Young's modulus in the range from 1500 to 3000 kg/mm$^2$.

Preferably, the FPC tape has a plurality of sprocket holes, and the molding die has ejector pins each of which is placed between adjacent sprocket holes when the FPC tape is placed in the molding die.

Preferably, the FPC tape has a plurality of sprocket holes. Further, the molding die has a gate adapted to cross at least one of the sprocket holes. Moreover, the molding die includes a wall which is placed in the gate and covers at least one of the sprocket holes. Furthermore, the aforesaid wall is separated from a side wall of the gate like an island.

Preferably, the gate is branched by the island-like wall into branches, and the branches join together on the FPC tape.

Preferably, the molded product is adapted so that a distance between outer edges of adjacent two semiconductor packages is a sum of a distance of 2 times a size of each of the semiconductor packages to be formed and a dimension of a gap between the adjacent two semiconductor packages. Further, the dimension of the gap is not more than 0.3 mm.

Preferably, each of semiconductor packages has alignment marks for cutting the molded product into the individual semiconductor packages. In this case, each of the alignment marks comprises a hole bored in the FPC tape and a pattern obtained by etching a layer provided on the FPC tape.

Preferably, the metal balls are simultaneously cleaned at the step of cutting. In this case, it is desirable that water for cooling a dicer is sprayed on a cutting blade of the dicer and on the metal balls.

Preferably, a plurality of FPC tapes, each of which includes a plurality of semiconductor chips, are set in a single molding die.

Preferably, the molding die comprises a plurality of blocks. Further, ejector pins are provided on each of the blocks.

Preferably, resin portions, which are thicker than the mold portion, is provided at the gate and a bent portion, respectively. Thus, warpage of each of semiconductor packages is prevented by the hardness of the resin portions.

Preferably, the molded product is cut so that each of semiconductor packages contains a plurality of semiconductor chips.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
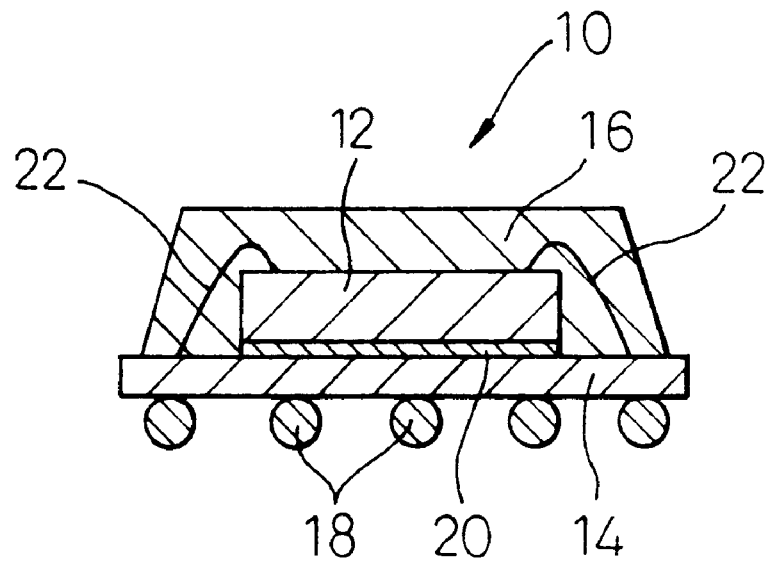
FIG. 1 is a cross-sectional view showing a semiconductor package according to the first embodiment of the present invention.

FIG. 1 shows a semiconductor package according to the first embodiment of the present invention. As shown in FIG. 1, a semiconductor package 10 has a semiconductor chip 12, an FPC tape 14 for mounting semiconductor chip 12 thereto, a mold resin 16 for protecting the semiconductor chip 12, and metal balls 18 provided on the FPC tape 14 for connecting the semiconductor chip 12 to a circuit board. The semiconductor chip 12 is fixed to the FPC tape 14 by a die bonding material 20. The mold resin 16 covers the semiconductor chip 12.

The FPC tape 14 is called a TAB tape and has electric circuits and electrode pads (not shown) provided on a polyimide resin tape. Electrode pads (not shown) of the semiconductor chip 12 are respectively connected to the electrode pads of the FPC 14 by bonding wires 22. Further, the metal balls 18 are solder balls and are connected to electric circuits of the semiconductor chip 12. Thus, the metal balls 18 are connected to the electric circuits of the semiconductor chip 12.

The semiconductor package 10 of FIG. 1 is a face-up wire-bonding type semiconductor package and is called a tape BGA.

Figure 2:
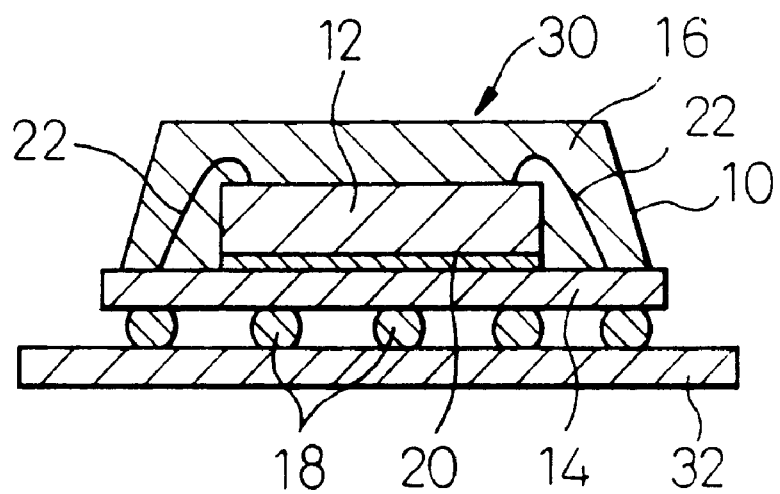
FIG. 2 is a cross-sectional view showing a semiconductor device including the semiconductor package of FIG. 1.

FIG. 2 shows a semiconductor device including the semiconductor package of FIG. 1. This semiconductor device 30 includes the semiconductor package 10 and a printed circuit board 32. The semiconductor package 10 has the same constitution as that of the semiconductor package shown in FIG. 1 and is connected to the printed circuit board 32 by the metal balls 18. Namely, the printed circuit board 32 has electric circuits and electrode pads (not shown). The metal balls 18 are connected to the electrode pads of the printed circuit board 32, respectively.

Figure 3:
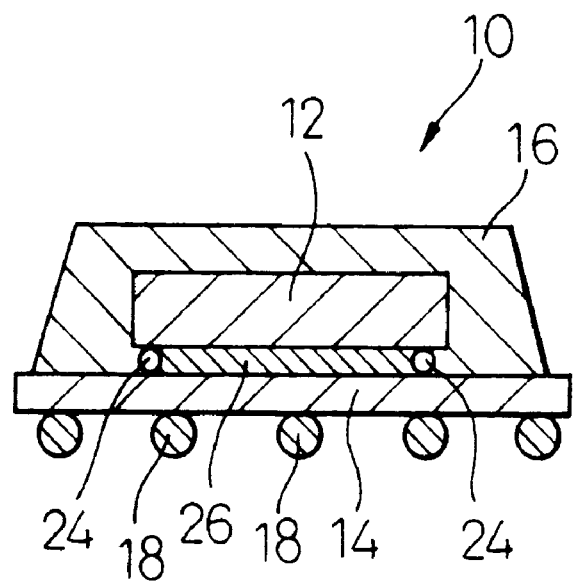
FIG. 3 is a cross-sectional view showing a semiconductor package according to the second embodiment of the present invention.

FIG. 3 shows a semiconductor package according to the second embodiment of the present invention. As shown in FIG. 3, a semiconductor package 10 has a semiconductor chip 12, an FPC tape 14 for mounting the semiconductor chip 12 thereto, a mold resin 16 for protecting the semiconductor chip 12, and metal balls 18 provided on the FPC tape 14 for connecting the semiconductor chip 12 to a circuit board. The semiconductor chip 12 is fixed to the FPC tape 14 by metal balls 24. An adhesive 26 is inserted between the semiconductor chip 12 and the FPC tape 14 so that the metal balls 24 are embedded therein. The mold resin 16 covers the semiconductor chip 12. This semiconductor package 10 is a face-down flip chip type semiconductor package and is called a tape BGA. As in the package of FIG. 1, the metal balls 18 are connected to the electric circuits of the semiconductor chip 12.

Figure 4:
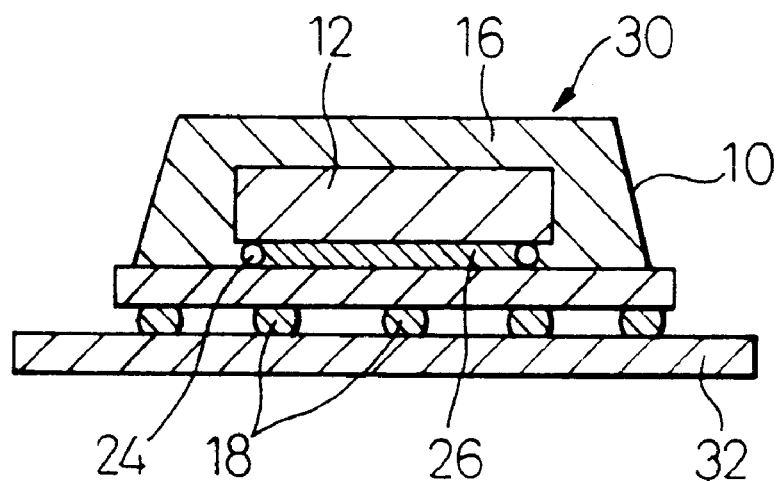
FIG. 4 is a cross-sectional view showing a semiconductor device including the semiconductor package of FIG. 3.

FIG. 4 shows a semiconductor device including the semiconductor package of FIG. 3. This semiconductor device 30 includes a semiconductor package 10 and a printed circuit board 32. This semiconductor package 10 has the same constitution as that of the semiconductor package shown in FIG. 3 and is connected to the printed circuit board 32 by the metal balls 18. Namely, the printed circuit board 32 has electric circuits and electrode pads (not shown). The metal balls 18 are connected to the electrode pads of the printed circuit board 32, respectively.

In the case of the semiconductor packages 10 illustrated in FIGS. 1 to 4, the mold resin 16 is molded by transfer-molding after the semiconductor chip 12 is mounted to the FPC tape 14. The molding temperature in the transfer-molding is about 170° C. to 180° C. As the temperature of the mold resin 16 falls from the molding temperature to room temperature, the mold resin 16 gradually contracts. As a result of molding the mold resin 16, the difference in coefficient of linear expansion between the mold resin 16 and the semiconductor chip 12 causes warpage in the semiconductor package 10.

Figure 5:
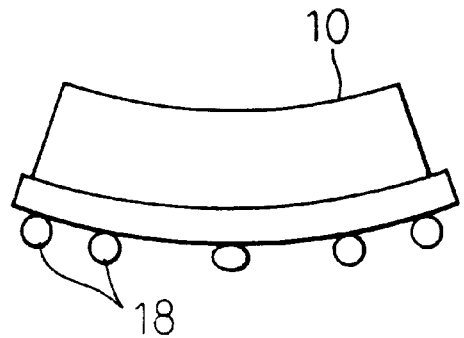
FIG. 5 is a view showing a semiconductor package in which warpage occurs.
Figure 6:
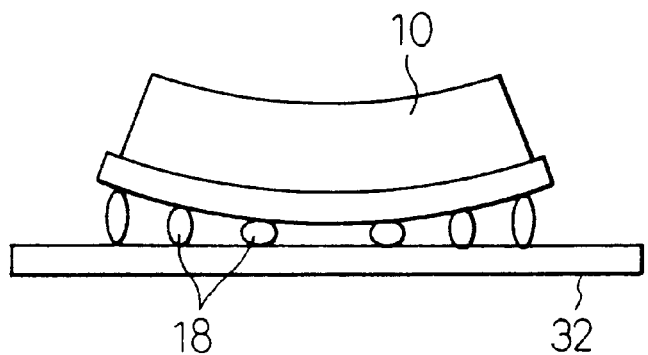
FIG. 6 is a view showing a circuit board to which the semiconductor package of FIG. 5 is mounted.
Figure 7:
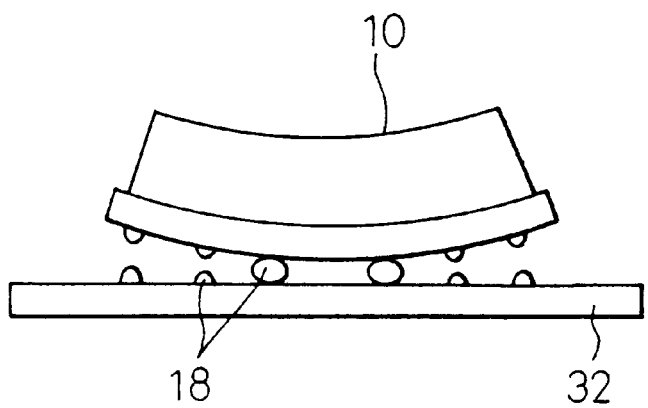
FIG. 7 is a view illustrating the semiconductor device of FIG. 6 in the case where stress is exerted on metal balls thereof.

FIG. 5 exaggeratingly illustrates the semiconductor package 10 when warpage occurs. FIG. 6 shows the semiconductor package 10 mounted to the printed circuit board 32. If the semiconductor package 10 warps, the metal balls 18 placed on the peripheral portion of the semiconductor package 10 are apt to become thin as compared with the metal ball 18 placed on the central portion of the semiconductor package 10. FIG. 7 shows that, during use, the thin metal ball 18 is subjected to stress, which is generated owing to the difference in amount of thermal deformation between the mold resin 16 and the printed circuit board 32, and is liable to break.

According to the present invention, the mold resin 16 is constituted so that the glass transition temperature thereof is not lower than 200° C., the coefficient of linear expansion thereof is 13 to 18 ppm/° C., and Young's modulus thereof is 1500 to 3000 kg/mm$^2$ in order to prevent the metal balls 18 from being broken due to stress during use. For example, the glass transition temperature of the mold resin 16 is not lower than 220° C., the coefficient $\alpha_1$ of linear expansion thereof is 15 ppm/° C., and Young's modulus thereof is 2000 kg/mm$^2$. In contrast, the coefficient $\alpha_1$ of linear expansion of the semiconductor chip 12 is 4 ppm/° C., and the coefficient $\alpha_1$ of linear expansion of the printed circuit board 32 is 16 ppm/° C.

With such constitution, the warpage of the semiconductor package 10 as illustrated in FIG. 5 can be reduced by increasing the glass transition temperature Tg of the mold resin 16, and the difference in the thermal deformation between the mold resin 16 and the printed circuit board 32 during use can be decreased by bringing the coefficient $\alpha_1$ of linear expansion of the mold resin 16 close to the coefficient $\alpha_1$ of linear expansion of the printed circuit board 32, so that stress exerted on the metal balls 18 is reduced and the metal balls 18 are not so easily broken. Furthermore, the mold resin 16 becomes relatively soft by lowering Young's modulus thereof, with the result that the stress exerted on the metal balls 18 is absorbed and the problem that the metal balls 18 become thin and liable to break is solved.

Figure 8:
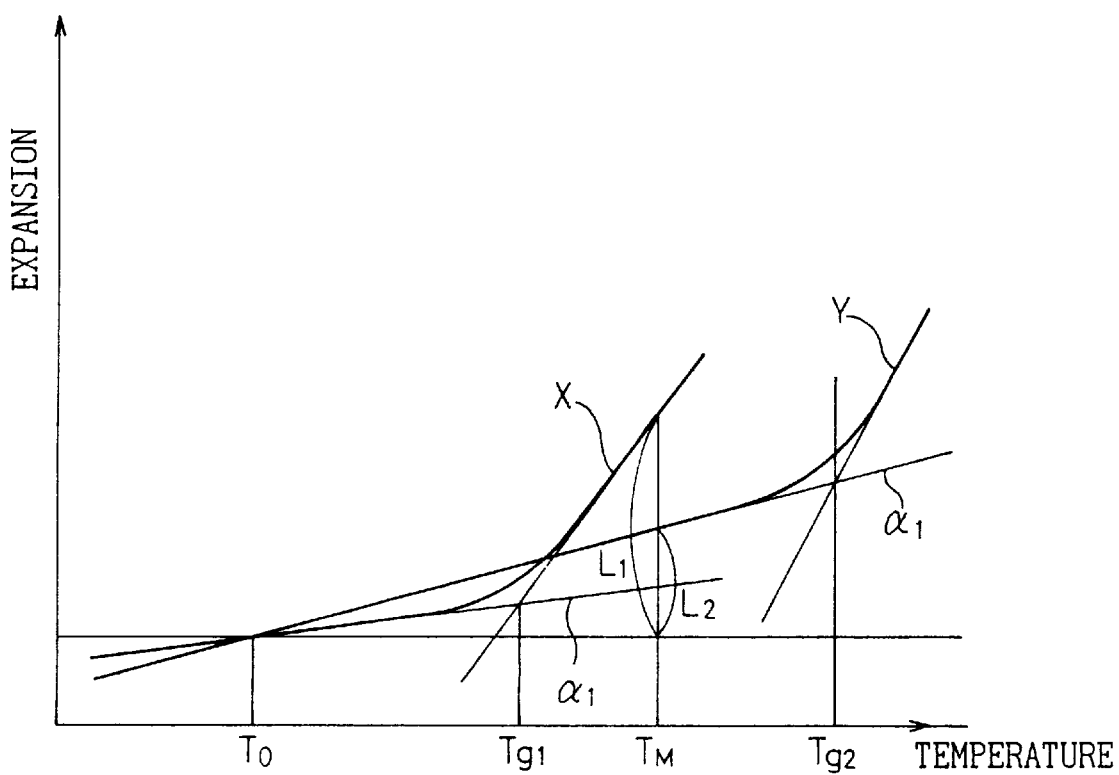
FIG. 8 is a graph showing the relationship between the temperature and the extension of the mold resin for illustrating the glass transition temperature and the coefficient of thermal expansion thereof.

FIG. 8 is a graph showing the relationship between the temperature and the expansion of the mold resin 16, which illustrates the glass transition temperature Tg and the coefficient $\alpha_1$ of thermal expansion thereof. The curve X indicates a characteristic of the mold resin, in which the glass transition temperature $Tg_1$ is lower than the molding temperature $T_M$, and the curve Y indicates another characteristic of the mold resin, in which the glass transition temperature $Tg_1$ is higher than the molding temperature $T_M$. The coefficient $\alpha_1$ of linear expansion of the mold resin on the curve Y is greater than that $\alpha_1$ of linear expansion of the mold resin on the curve X.

In the case of the mold resin corresponding to the curve X, the amount of contraction of the mold resin becomes $L_1$ when the temperature of the mold resin falls from the molding temperature $T_M$ to the ordinary temperature $T_0$. In the case of the mold resin corresponding to the curve Y, the amount of contraction of this mold resin becomes $L_2$ when the temperature of the mold resin falls from the molding temperature $T_M$ to the ordinary temperature $T_0$. As is shown in FIG. 8, there is a relationship of $L_1 > L_2$. Therefore, it is possible to reduce thermal contraction of the mold resin during molding and thus to decrease warpage of the semiconductor package 10, by making the glass transition temperature Tg thereof higher than the molding temperature $T_M$ thereof, even if the coefficient $\alpha_1$ of linear expansion of the mold resin is increased.

However, study by the inventors of the present invention has revealed that there is a small effect of reducing the warpage of the semiconductor package 10 when the glass transition temperature Tg of the mold resin 16 is only a little higher than the molding temperature $T_M$. Also, it has been found that, if the molding temperature $T_M$ of the mold resin 16 is from 175° C. to 180° C. and the glass transition temperature thereof is not lower than 200° C. which is considerably higher than the molding temperature $T_M$ thereof, warpage of the semiconductor package 10 can be reliably reduced. Preferably, the glass transition temperature Tg of the mold resin 16 is not lower than 205° C.

Thus, when the glass transition temperature Tg of the mold resin 16 is considerably higher than the forming temperature $T_M$, a semiconductor device with small warpage can be obtained even if there is variation in the molding conditions. Conversely, when the glass transition temperature of the mold resin is not higher than 200° C., the variation in the molding conditions affects a semiconductor package, so that a semiconductor device with small warpage will not be obtained. In the case that there is variation in temperature among various positions of a die used at the time of molding, for example, the temperature at a position of the die is 180 ° C., while the temperature at another position thereof is almost 200° C. In such a case, the amount of contraction of the mold resin 16 is large.

The mold resin 16 is approximately made of (a) a base resin (a base material/a curing agent), (b) a filler (a silica filler) and (c) an addition agent. An epoxy resin having a multifunctional groups is used as a base material of the base resin. For instance, the following resins a1 and a2 may be used as the base material of the base resin. Further, the following resin a3 may be used as the curing agent of the base resin. Although both resins a1 and a2 may be simultaneously used, only one of these resins may be used as the base material of the base resin.

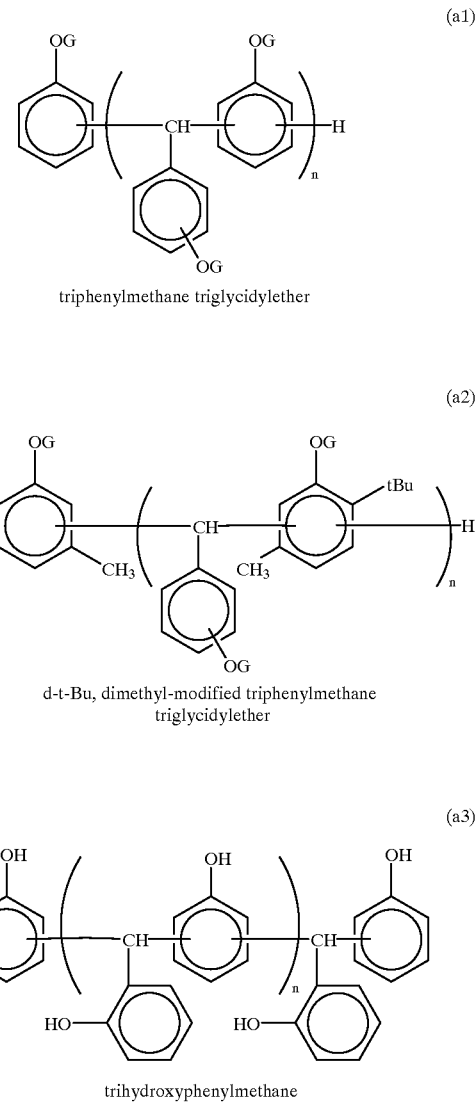

(a1) triphenylmethane triglycidylether (a2) d-t-Bu, dimethyl-modified triphenylmethane triglycidylether (a3) trihydroxyphenylmethane By using this base resin, the glass transition temperature Tg of the mold resin 16 can be set at a value which is not lower than 200° C., preferably not lower than 205° C. Moreover, the coefficient $\alpha_1$ 1 of linear expansion of the mold resin 16 can be made to be close to the coefficient $\alpha_1$ of linear expansion of the printed circuit board 32. Furthermore, the coefficient $\alpha_1$ of linear expansion of the mold resin 16 can be changed by increasing or decreasing the amount of the filler (silica filler). Additionally, Young's modulus E of the mold resin 16 can be reduced by adding addition agents such as elastomers, for example, silicon oil and silicon rubber, thereto. For instance, when the aforementioned base resin is used, the mold resin 16 having the following features can be formed. Sample No. 2 is obtained by adding the addition agent to Sample No. 1 to thereby reduce Young's modulus thereof. Incidentally, Young's modulus E can be changed according to the kind and size of the semiconductor package.

| Example No. | Filler Amount (Wt %) | $\alpha_1$ (ppm/° C.) | Tg (° C.) | E (kg/mm$^2$) | Warpage ($\mu$m) | Reliability |
|---|---|---|---|---|---|---|
| 1 | 75–85 | 13–18 | 200 or more | 2000–3000 | 100–150 | 500–1000 |
| 2 | 75–85 | 13–28 | 200 or more | 1500–2000 | 100–150 | 1000–1500 |

Initial warpage of an 18-square-mm semiconductor package is reduced to about 100 $\mu$m by setting the glass transition temperature Tg not lower than 200° C. and coefficient $\alpha_1$ of linear expansion close to that of the circuit board, and molding under the a, region. Moreover, the package reliability is improved by about 5 to 15 times.

The following table shows comparative examples in which warpage of the semiconductor package is reduced by permitting the package to contain about 90 Wt % of fillers and reducing the coefficient al of linear expansion thereof to a value which is not more than 10 ppm/° C. For example, when an 18-square-mm semiconductor package contains such an amount of filler, a warpage of about 120 $\mu$m occurs. To make the package contain such an amount of filler, a low viscosity epoxy resin (for instance, of the biphenyl type) having a low glass transition temperature Tg is usually used.

Figure 10:
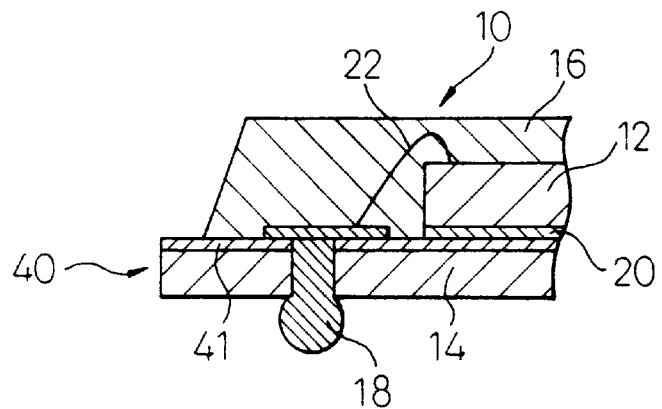
FIG. 10 is a cross-sectional view showing a modification of the semiconductor package.

In FIG. 10, the buffer means 40 comprises a buffer layer 41 provided on the surface of the FPC 14 on the side where the semiconductor chip 12 is placed. The buffer layer 41 is an adhesive layer of the three-layered FPC tape 14. Incidentally, this buffer layer 41 is a thermoplastic adhesive layer is softer than the mold resin 16. The copper land 19 is formed on the buffer layer 41. The die bonding material 20 is applied to the surface of the buffer layer 41 so as to fix the semiconductor chip 12.

Figure 11:
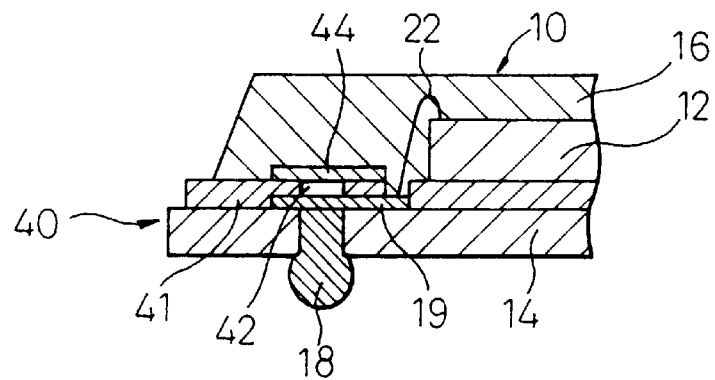
FIG. 11 is a cross-sectional view showing another modification of the semiconductor package.

In FIG. 11, the buffer means 40 comprises a buffer layer 41 and an air layer that are provided on the surface of the FPC 14 on which the semiconductor chip 12 is placed. The buffer layer 41 comprises a soft resin layer or a thermoplastic adhesive layer. The buffer layer 41 covers the copper land 19 except for the bonding region of the bonding wires 22. A cavity 42 is formed in the buffer layer 41 above the copper

| Comparative Example No. | Filler Amount (Wt %) | $\alpha_1$ (ppm/° C.) | Tg (° C.) | E (kg/mm$^2$) | Warpage ($\mu$m) | Reliability |
|---|---|---|---|---|---|---|
| 1 | 85–88 | 10 | 120–150 | 1500–2000 | 200 | 100–200 |
| 2 | 88–92 | 8 | 120–150 | 2000–3000 | 100–150 | 200–300 |

FIGS. 9 to 15 show the other embodiments of the present invention.

Each of semiconductor packages 10 according to these embodiments has a semiconductor chip 12, an FPC tape 14 for mounting the semiconductor chip 12 thereto, metal balls 18 provided on said FPC tape for connecting the semiconductor chip to a circuit board, and buffer means 40 for buffing stress exerted on the metal balls 18. The semiconductor package 10 is connected to the printed circuit board 32 by the metal ball 18, as illustrated in FIGS. 2 and 4.

As a result of providing the buffer means 40 in the semiconductor package 10, in the case that the semiconductor package 10 is used by being mounted to the printed circuit board 32, even when the metal balls 18 are subjected to stress due to the relative deformation between the semiconductor package 10 and the printed circuit board, such stress is mitigated. These embodiments thus solve the problem that the metal balls become thin and liable to break.

Figure 9:
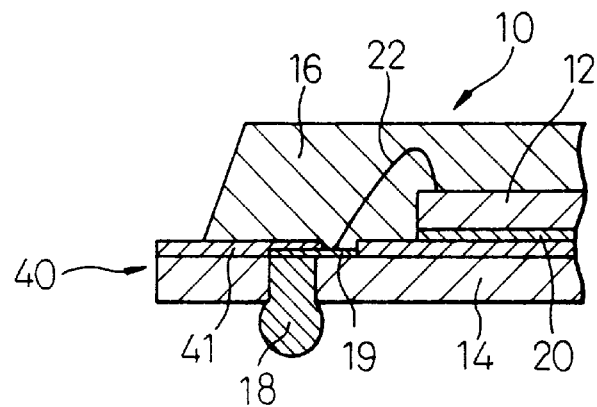
FIG. 9 is a cross-sectional view showing a semiconductor package according to the third embodiment of the present invention.

In FIG. 9, the buffer means 40 comprises a buffer layer 41 provided on the surface of the FPC 14 on the side where the semiconductor chip 12 is placed. The buffer layer 41 is formed by applying a material, which is softer than the mold resin 16, onto the surface of the FPC tape 14. A copper land 19 (an electrode pad to which circuit member or the metal ball 18 is fixed) is provided on the FPC 14. The buffer layer 41 covers the copper land 19 and is stacked on nearly the entirety of the surface of the FPC tape 14. However, the bonding region (a part of the copper land 19) of the bonding wire 22 is exposed. A die bonding material 20 is applied to the surface of the buffer layer 41 so as to fix the semiconductor chip 12.

land 19 on the metal ball 19. The cavity 42 is sealed with a resin cap 44 to thereby form the air layer. This air layer composes the buffer means 40 for buffing stress exerted on the metal ball 18, together with the buffer layer 41. The die bonding material for fixing the semiconductor chip 12 is applied to the surface of the buffer layer 41.

Figure 12:
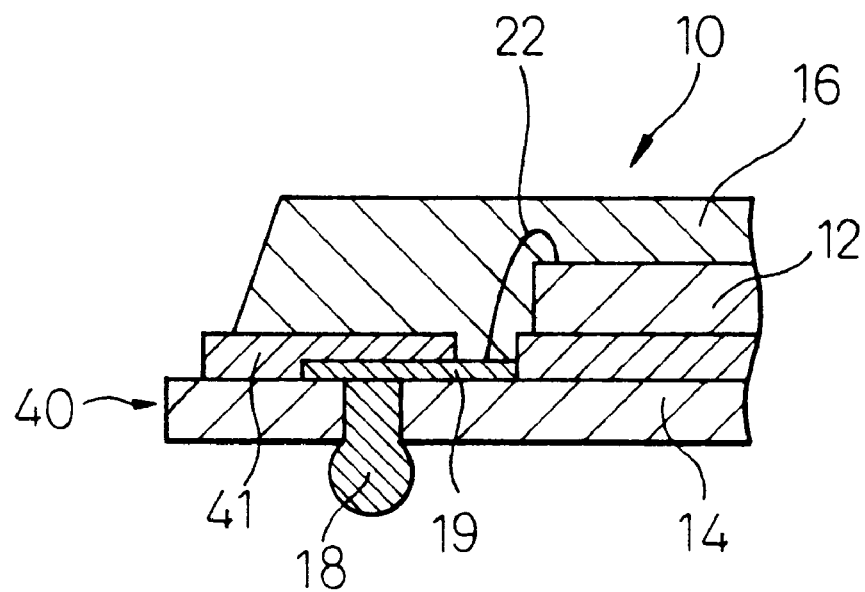
FIG. 12 is a cross-sectional view showing a further modification of the semiconductor package.

In FIG. 12, the buffer means 40 comprises a buffer layer 41 provided on the surface of the FPC 14 on which the semiconductor chip 12 is placed. The buffer layer 41 is formed by sticking a tape made of a resin (for example, polyimide), which is softer than the mold resin 16, onto the surface of the FPC tape 14. The rest of the constitution of the buffer means is similar to that shown in FIG. 9.

Figure 13:
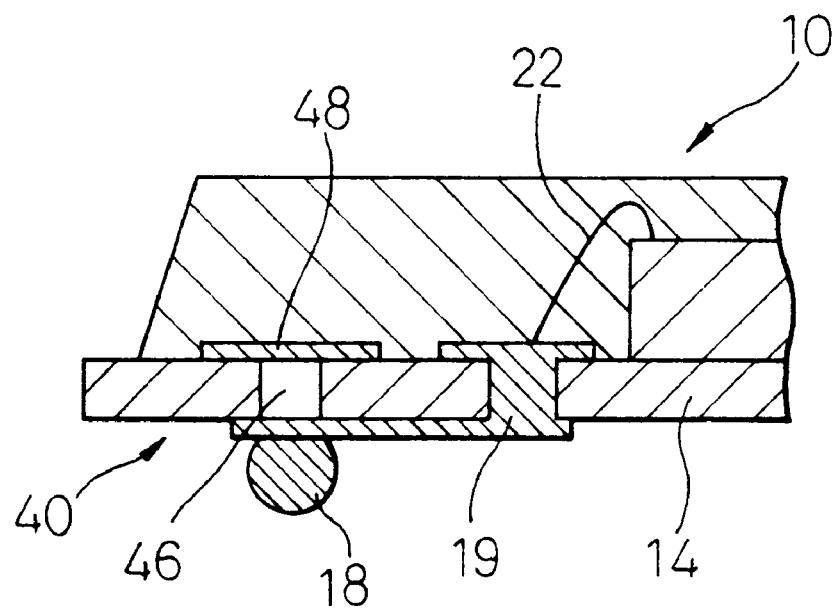
FIG. 13 is a cross-sectional view showing a still further modification of the semiconductor package.

In FIG. 13, the buffer means 40 comprises an air layer that is formed by a cavity 46 provided in the FPC tape 14. The cavity 46 is sealed with a resin cap 48. Copper lands 19 are formed on each of the top and bottom surfaces of the FPC tape 14, and the upper and lower copper lands are connected with each other by through holes. The metal balls 18 are fixed to the lower copper lands 19.

Figure 14:
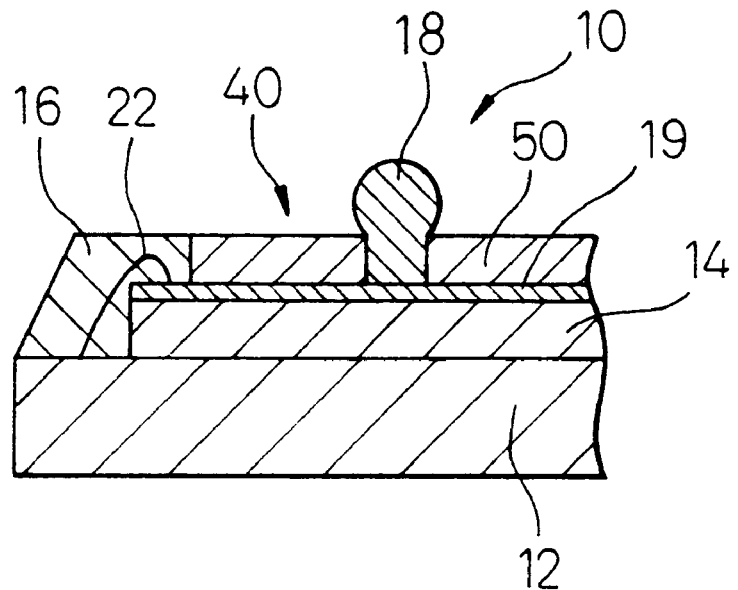
FIG. 14 is a cross-sectional view showing a further modification of the semiconductor package.

In FIG. 14, the semiconductor package 10 is of an area type in which the area of the semiconductor chip 12 is larger than that of the FPC tape 14. The FPC tape 14 is disposed on the semiconductor chip 12, and the bonding wires 22 connect the copper lands 19 to the electrode pads of the semiconductor chip 12. The metal balls 18 project from the copper lands 19 provided on the surface of the FPC tape 14. An insulating layer 50 is placed on the FPC tape 14 in such a way as to fill a ditch formed around the metal balls 18. The mold resin 16 is provided in such a manner as to cover the peripheral portions of the semiconductor chip 12 and the FPC tape 14. In this constitution, the buffer means 40 is constituted by the insulating layer 50.

Figure 15:
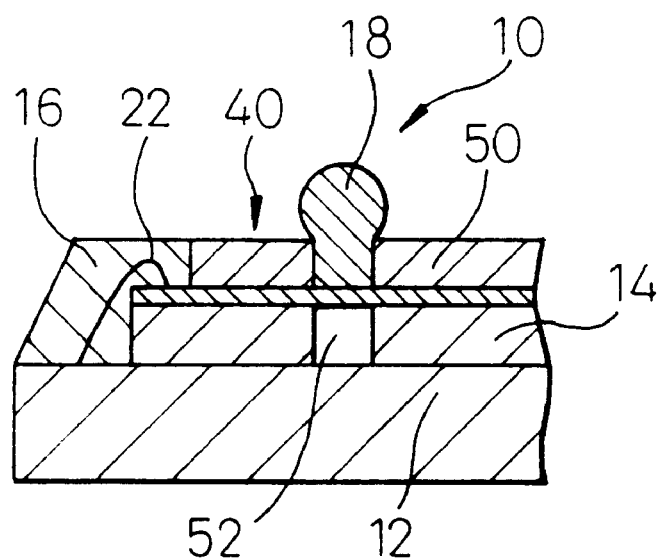
FIG. 15 is a cross-sectional view showing a yet further modification of the semiconductor package.

In FIG. 15, the semiconductor package 10 is of an area type in which the area of the semiconductor chip 12 is larger than that of the FPC tape 14, as in the case shown in FIG. 14. The insulating layer 50 is placed on the FPC tape 14 in such a way as to fill a ditch formed around the metal balls 18. Further, a cavity 52 is formed under the metal ball 18 and in the FPC tape 14 thereby forming an air layer. In this constitution, the buffer means 40 is constituted by the insulating layer 50 and the air layer.

Figure 16:
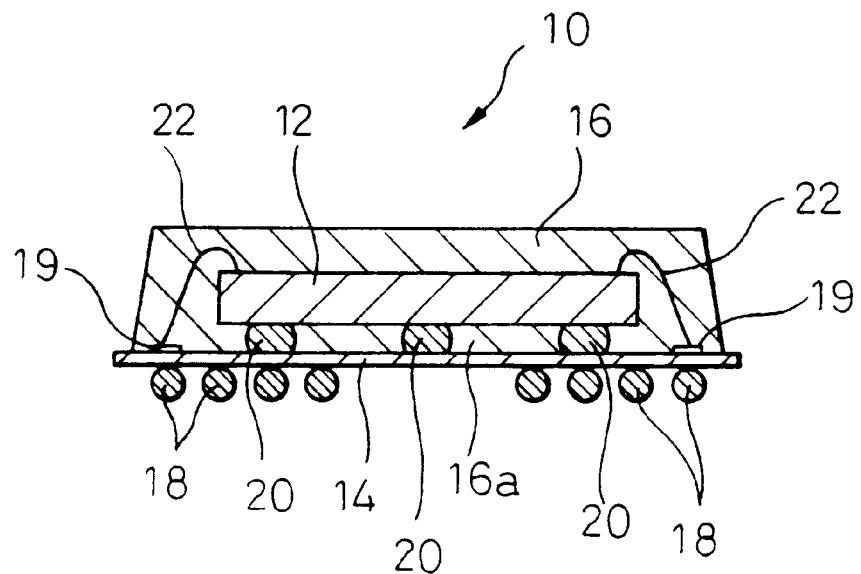
FIG. 16 is a cross-sectional view showing a semiconductor package according to the fourth embodiment of the present invention.
Figure 17:
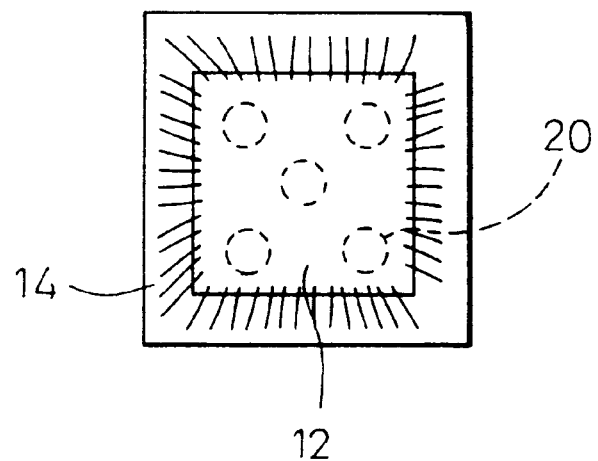
FIG. 17 is a plan view showing the semiconductor package of FIG. 16 before resin molding.

FIGS. 16 and 17 show a semiconductor package according to the fourth embodiment of the present invention. The semiconductor package 10 comprises a semiconductor chip 12, a FPC tape 14 for mounting the semiconductor chip 12 thereto, a mold resin 16 for protecting the semiconductor chip 12, and metal balls 18 provided on the FPC tape 14. The semiconductor chip 12 is fixed to the FPC tape 14 by a die bonding material 20.

The semiconductor package 10 shown in FIG. 16 is called a tape BGA of the face-up wire-bonding type. The FPC tape 14 is called a TAB tape and has electric circuits and electrode pads 19 on a polyimide resin tape. The electrode pads (not shown) of the semiconductor chip 12 are connected to the electrode pads 19 of the FPC tape 14 by bonding wires 22. Further, the metal balls 18 are solder balls and are connected to the electric circuits on the FPC tape 14.

The die bonding material 20 is an adhesive provided at partial regions relative to the bottom surface of the semiconductor chip 12. A die bonding liquid adhesive (an insulating paste adhesive) is used as the die bonding material 20. In this embodiment, the die bonding material 20 is provided in five small regions. As a result, a space is formed between the bottom surface of the semiconductor chip 12 and the FPC tape 14 at regions where the die bonding material 20 does not exist. In a manufacturing process, the die bonding material 20 is applied to the FPC tape 14 to fix the semiconductor chip 12 to the FPC tape 14, the bonding wires 22 are then attached to the semiconductor chip 12, and the package is resin-sealed by the mold resin 16.

The mold resin 16 covers the top surface of the semiconductor chip 12 and is inserted into the space between the bottom surface of the semiconductor chip 12 and the FPC tape 14. The mold resin inserted between the bottom surface of the semiconductor chip 12 and the FPC tape 14 is designated by the reference character 16a. The mold resin 16 and 16a is arranged to sandwich the semiconductor chip 12. Therefore, the semiconductor package 10 is hard to warp, even when thermal stress is applied thereto, and consequently, in the case that the semiconductor package 10 is mounted to the printed circuit board by the metal balls 18, the reliability of the joint therebetween, which is realized by the metal balls 18, is enhanced.

Especially, in the CSP type semiconductor devices in which a percentage of the semiconductor chip 12 in the semiconductor package 10 is high, the ratio of the mold resin 16 to the semiconductor device is small. Thus, the protecting function is enhanced by causing the mold resin 16 to flow into the space under the bottom surface of the semiconductor chip 12 of this embodiment. Consequently, the semiconductor package 10 becomes difficult to warp.

Further, even in the case of the semiconductor package of such constitution, it is preferable that the resin mold 16 has a glass transition temperature not lower than 200° C., a coefficient of linear expansion in the range from 13 to 18 ppm/° C., and Young's modulus in the range from 1500 to 3000 kg/mm$^2$, similarly as in the aforementioned embodiments. If such a mold resin 16 is used, the semiconductor package 10 becomes more difficult to warp. This is true for the mold resin 16 in FIGS. 18 to 21.

Figure 18:
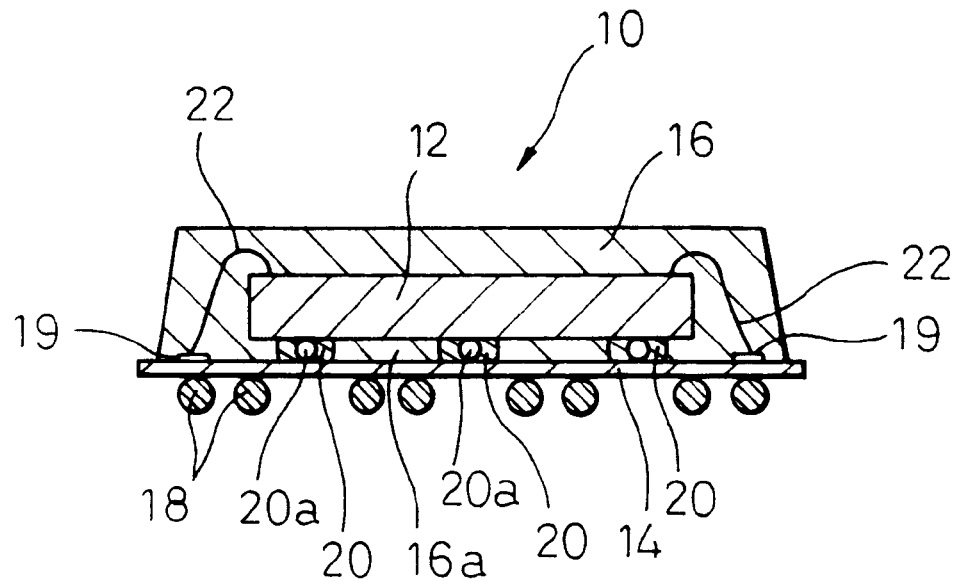
FIG. 18 is a cross-sectional view showing a modification of the semiconductor package.

FIG. 18 shows a modification of the semiconductor package 10 illustrated in FIG. 16. This example is similar to the semiconductor package shown in FIG. 16 except for the die bonding material 20. The die bonding material 20 is an insulating paste adhesive containing spacers. Spacers 20a are small balls called "beads". For example, the thickness of the die bonding material 20 can be increased by inserting the spacers having a diameter of 50 to 100 μm. Thus, the gap between the bottom surface of the semiconductor chip 12 and the FPC tape 14 is increased sufficiently to the extent that the mold resin 16a can be inserted thereinto. Further, the insertion of the spacers 20a prevents the semiconductor chip 12 from being inclined. If the height of the die bonding material 20 is increased, local stress due to the difference in thermal expansion between the semiconductor package 10 and the printed circuit board, which is exerted on the solder joint, decreases. This results in enhanced durability of the metal balls 18 after the mounting of the semiconductor package 10 to the printed circuit board.

Further, the metal balls 18 to be mounted to the FPC tape 14 are placed at positions other than the regions where the die bonding material 20 is placed. This also results in a reduction in the local stress due to the difference in thermal expansion therebetween. Consequently, the durability of the metal balls 18 after the mounting of the semiconductor package 10 to the printed circuit board can be enhanced.

Figure 19:
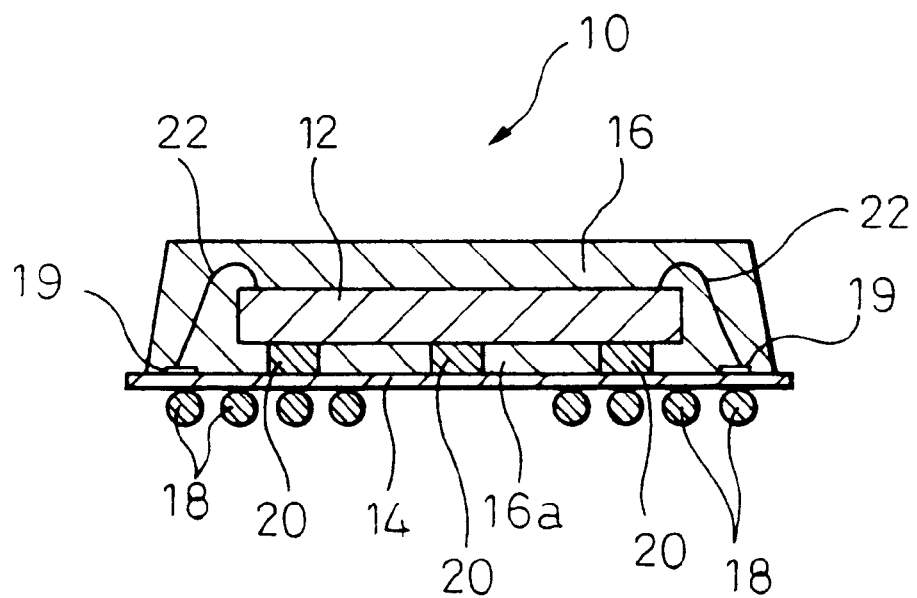
FIG. 19 is a cross-sectional view showing another modification of the semiconductor package.

FIG. 19 shows another modification of the semiconductor package 10 illustrated in FIG. 16. This example is similar to the semiconductor package shown in FIG. 16 except for the die bonding material 20. This die bonding material 20 is constituted by a die bonding tape.

Figure 20:
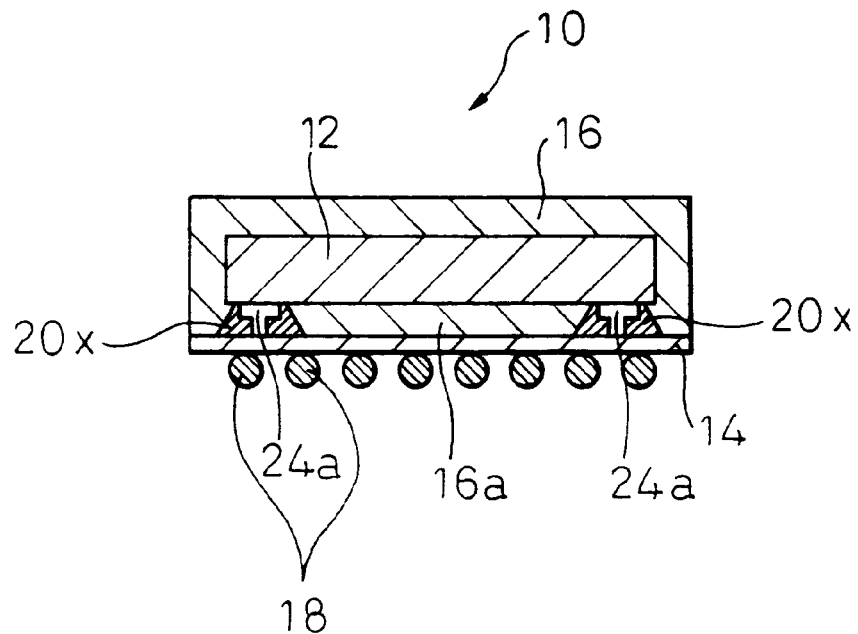
FIG. 20 is a cross-sectional view showing a further modification of the semiconductor package.

FIG. 20 shows a further modification of the semiconductor package 10 illustrated in FIG. 16. As shown in FIG. 20, the semiconductor chip 12 is mounted to the FPC tape 14 by a face-down flip chip. The semiconductor chip 12 has gold bump electrodes 24a, instead of the metal balls 24 shown in FIG. 3. Anisotropic conductive adhesive agents 20x envelope the bump electrodes 24a and are provided in partial regions under the bottom surface of the semiconductor chip 12. In this case, the mold resins 16 and 16a cover the top surface of the semiconductor chip 12 and are inserted into the space provided between the bottom surface of the semiconductor chip 12 and the FPC tape 14. The mold resin 16 and 16a is arranged to sandwich the semiconductor chip 12. Therefore, the semiconductor package 10 is hard to warp, even when thermal stress is applied thereto. Consequently, in the case that the semiconductor package 10 is mounted to the printed circuit board by the metal balls 18, reliability of the joint therebetween, which is realized by the metal balls 18, is enhanced.

Figure 21:
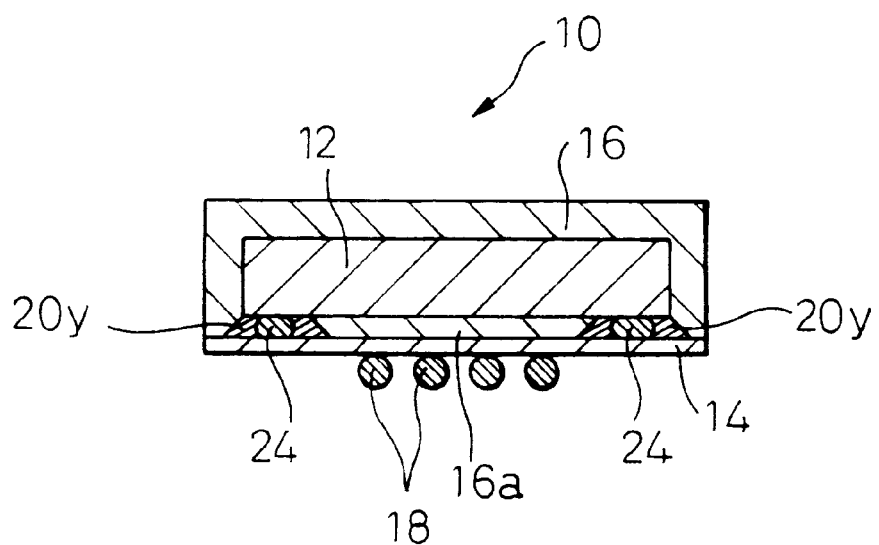
FIG. 21 is a cross-sectional view showing a still further modification of the semiconductor package.

FIG. 21 shows a still further modification of the semiconductor package 10 illustrated in FIG. 16. As shown in FIG. 21, the semiconductor chip 12 is mounted to the FPC tape 14 by a face-down flip chip. The semiconductor chip 12 has the metal balls 24. An underfill material 20y envelopes the metal balls 24 and is provided in partial regions under the bottom surface of the semiconductor chip 12. In this case, the mold resins 16 and 16a cover the top surface of the semiconductor chip 12 and are inserted into the space provided between the bottom surface of the semiconductor chip 12 and the FPC tape 14. The mold resins 16 and 16a are arranged to sandwich the semiconductor chip 12. Therefore, the semiconductor package 10 is hard to warp, even when thermal stress is applied thereto. Consequently, in the case that the semiconductor package 10 is mounted to the printed circuit board by the metal balls 18, reliability of the joint therebetween, which is realized by the metal balls 18, is enhanced.

As described above, according to the present invention, the durability and reliability of the metal balls for connecting the semiconductor chip to the circuit board are enhanced.

Figure 22:
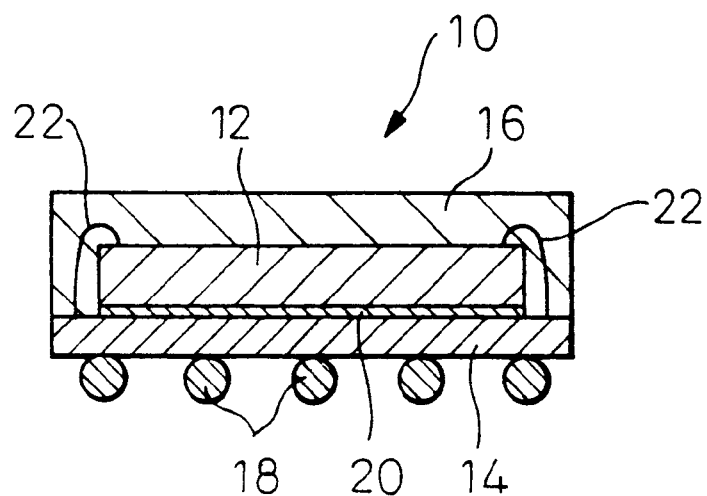
FIG. 22 is a cross-sectional view illustrating an example of a semiconductor package manufactured according to the fifth embodiment of the present invention.

FIG. 22 is a cross-sectional view showing an example of a semiconductor package which is manufactured according to the fifth embodiment of the present invention. As shown in FIG. 22, a semiconductor package 10 has a semiconductor chip 12, an FPC tape 14 for mounting the semiconductor chips 12 thereto, a mold resin 16 for protecting the semiconductor chip 12, and metal balls 18 provided on the FPC tape 14 for connecting the semiconductor chip 12 to a circuit board. The semiconductor chip 12 is fixed to the FPC tape 14 by a die bonding material 20. The mold resin 16 covers the semiconductor chip 12. This semiconductor package 10 is an FBGA of the CSP type in which the metal balls 18 acting as electrodes are arranged at a fine pitch.

The FPC tape 14 is called a TAB tape and has electric circuits and electrode pads (not shown) provided on a polyimide resin tape. Electrode pads (not shown) of the semiconductor chip 12 are respectively connected to electrode pads of the FPC 14 by bonding wires 22. Further, the metal balls 18 are solder balls and are connected to electric circuits of the semiconductor chip 12. Thus, the metal balls 18 are connected to the electric circuits of the semiconductor chip 12.

The semiconductor package 10 using the FPC tape 14 is more liable to warp than that using a ceramic circuit board. Preferably, a resin, which does not cause the semiconductor package 10 to warp, is selected as the mold resin 16. An example of the preferred mold resin 16 is the aforementioned resin adapted so that the glass transition temperature is not lower than 200° C., the coefficient of linear expansion is in the range from 13 to 18 ppm/° C., and Young's modulus is in the range from 1500 to 3000 kg/mm².

Figure 23:
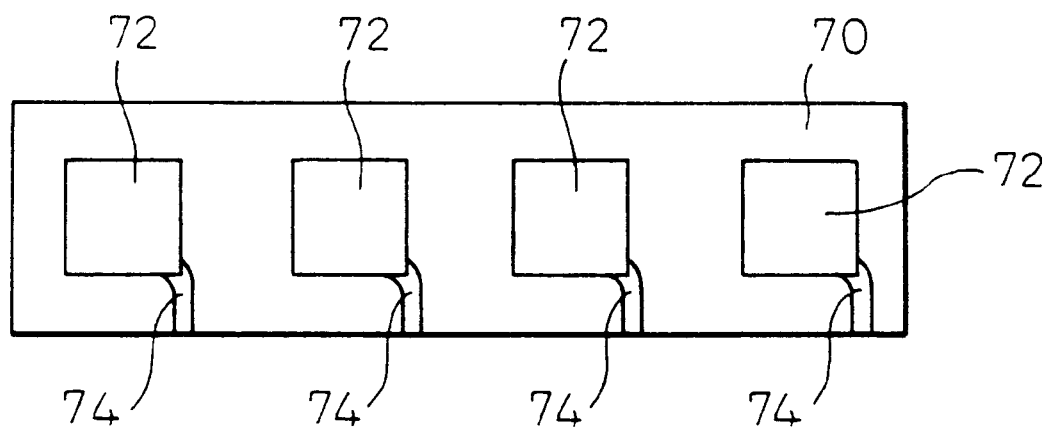
FIG. 23 is a view illustrating the step of resin-molding of a conventional semiconductor package.

FIG. 23 shows the step of resin-molding a conventional semiconductor package. In FIG. 23, reference numeral 70 designates an FPC tape to which a plurality of semiconductor chips 12 (not shown in FIG. 23) are mounted. The FPC tape 70 is put into a mold die which has a plurality of cavities 72. Each of the cavities 72 is formed in such a manner as to be suitable for one semiconductor chip 12, and has a gate 74. If such a resin molding step is employed, the shape of the cavity 72 should be designed again when the kind of the semiconductor package 10 is changed. Manufacturing the conventional semiconductor package is thus time-consuming and costly.

Figure 24:
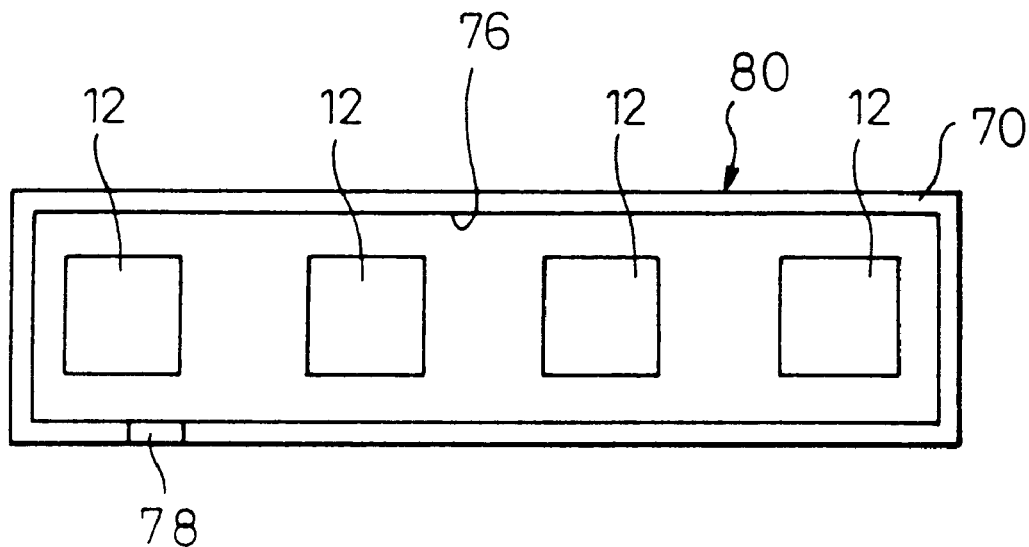
FIG. 24 is a view illustrating the step of resin-molding of a semiconductor package according to the present invention.
Figure 25:
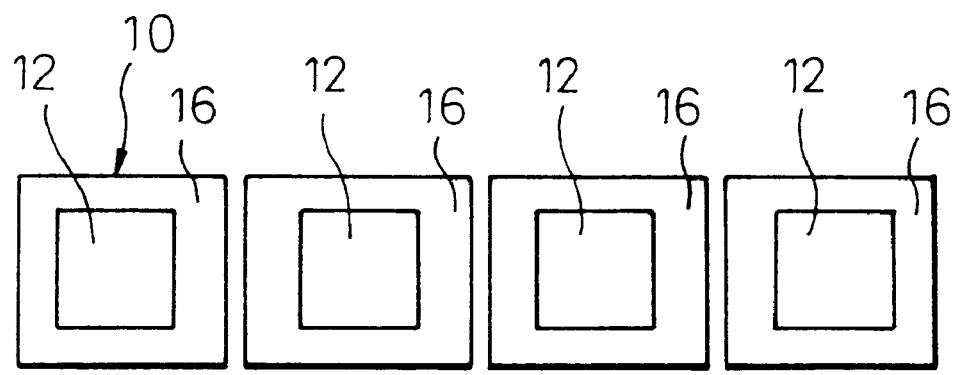
FIG. 25 is a view illustrating the cutting step to be performed after the step illustrated in FIG. 24.

FIG. 24 shows the step of resin-molding a semiconductor package according to the present invention. FIG. 25 shows the cutting step to be performed after the step shown in FIG. 24. In FIG. 24, reference numeral 70 designates an FPC tape to which a plurality of semiconductor chips 12 are mounted. The FPC tape 70 is put into a mold die having a cavity 76. The area of this cavity 76 is approximately equal to the total area of the plurality of semiconductor chips 12, so that the plurality of semiconductor chips 12 are collectively resin-molded. The cavity 76 has a gate 78. When the resin is introduced into the cavity 76 from the gate 78, the resin fills the cavity 76, a (semifinished) molded product 80 is formed.

As shown in FIG. 25, the molded product 80 is cut into individual semiconductor packages 10 (the resin and the tape are cut by a dicer). Incidentally, the metal balls 18 shown in FIG. 22 are mounted to the FPC tape 70 after the molding step illustrated in FIG. 24, and before the cutting step illustrated in FIG. 25. The FPC tape 14 shown in FIG. 22 is obtained by cutting the FPC tape 70 shown in FIG. 24 into pieces each having a corresponding one of the semiconductor packages 10.

Thus, according to the present invention, the plurality of semiconductor chips 12 collectively undergo transfer-molding and, subsequently, the molded product 80 is cut into pieces each having a size corresponding to the individual semiconductor chip 12. In the case of the semiconductor package 10 using the FPC tape (namely, the TAB tape), the width of the FPC tape 14 is constant, for instance, 35 mm, regardless of the kind of the semiconductor chip 12. Since the range of size of various kinds of the semiconductor chips 12 can be predicted, the width of the cavity 76 can be set so that the cavity 76 contains the semiconductor chips 12 of various sizes. Consequently, the present invention can deal with alteration of the design of the semiconductor package 10 using the FPC (or TAB) tape by preparing one mold die having such a cavity 76. Needless to say, the present invention can cope with a reduction in lead time of semiconductor devices by preparing such a mold die.

A column of semiconductor chips 12 can be arranged on a 35-mm-wide FPC tape 14. According to the present invention, a 70-mm-wide FPC tape 14 is used, so that two columns of semiconductor chips 12 can be arranged on this FPC tape and collectively molded. Alternatively, an FPC, whose width is a multiple of the width of 35 mm, is used, so that a number of columns of semiconductor chips 12 can be arranged thereon and collectively molded. Consequently, many semiconductor packages 10 can be formed at once.

A method of collectively molding semiconductor chips has been tried in the combination of potting and a printed wiring board, but such a method has not been contemplated for the semiconductor package 10 using the FPC (or TAB) tape 14. This is because the semiconductor packages 10 using the FPC (or TAB) tape are apt to largely warp and thus semiconductor chips cannot be collectively molded. Even if semiconductor chips can be collectively molded, semiconductor packages 10 cannot be fed to a production line in the case that the semiconductor packages 10 are apt to largely warp.

According to the present invention, since the mold resin 16 enabling reduction in warpage of a semiconductor package is obtained, as described above, semiconductor packages 10 can be collectively molded and the semiconductor packages 10 can be fed through the production line. For instance, in the case of using an ordinary resin in the semiconductor package 10, the warpage thereof is about 4 mm, but in the case of using the aforementioned resin according to the present invention, the warpage of the semiconductor package 10 is about 0.2 mm. If the warpage of the semiconductor package 10 is not more than about 2 mm, such a semiconductor package 10 can be fed to processes to be performed on the production line. As an additional effect, damage to the semiconductor package 10, which is caused by peeling off end faces thereof, is reduced by cutting the package 10 by means of a dicer. Consequently, reliability of the semiconductor package 10 is enhanced.

Figure 26:
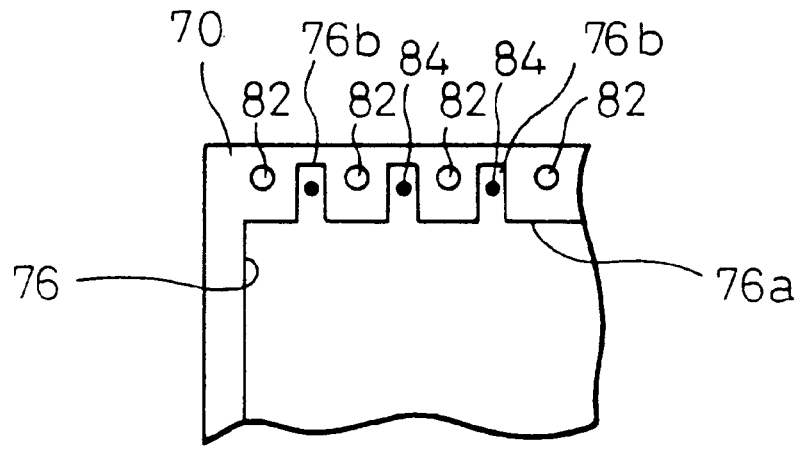
FIG. 26 is a view showing a bent-side portion of a cavity used in the molding step.

FIG. 26 shows a bent-side portion of the cavity used in the molding step. FIG. 26 also shows the FPC tape 70. The FPC tape 70 has a plurality of sprocket holes 82. The sprocket holes 82 are usually provided in the FPC 70 when the user purchases FPC tapes 70 from a tape maker. A side end portion 76a of the cavity 76 is arranged in such a manner as to be placed to the inner side of the sprocket holes 82 of the FPC 70.

A molding die (see a molding die 100 shown in FIG. 41, for example) has ejector pins 84 for pushing products upon completion of the molding. In FIG. 26, each of the ejector pins 84 is positioned between the adjacent sprocket holes 82 when the FPC tape 70 is placed in the molding die. The cavity 76 has portions 76b each projecting from the side end portion 76a to the outer side. The ejector pins 84 are placed at positions above these projecting portions 76b.

When the resin fills the cavity 76, the resin also fills the projecting portions 76b. When the molding die is opened upon completion of the molding, the ejector pins 84 push the resins, which have filled the projecting portions 76b of the cavity 76, from the molding die. Since the ejector pins 84 are placed on the outer side of the side end portion 76a of the cavity 76, the inner part of the side end portion 76a of the cavity 76 can be utilized as an effective area, so that the number of semiconductor packages 10 obtained from a predetermined area of the cavity 76 and the FPC tape 70 can be maximized. An increase in the number of the semiconductor packages 10 obtained per cavity contributes to reduced cost.

Figure 27:
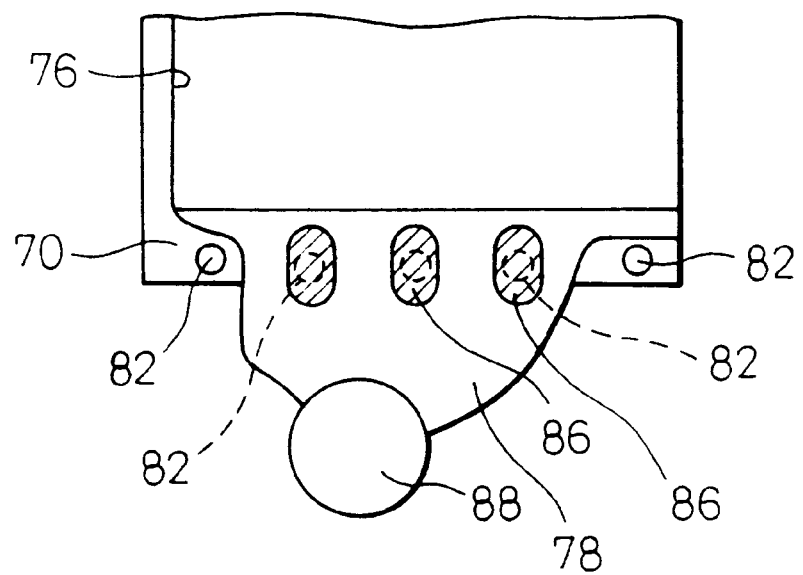
FIG. 27 is a view showing a gate-side portion of a cavity used in the molding step.

FIG. 27 shows a gate-side portion of the cavity used in the molding step. The method of collectively molding semiconductor chips as illustrated in FIG. 24 has encountered the problem of the filling ability of the resin. In the portion illustrated in FIG. 27, the gate 78 extends across the plurality of sprocket holes 82. The molding die includes walls 86 which are placed in the gate 78 and cover the respective sprocket holes 82. These walls 86 are separated from the side wall of the gate 78 like islands. The gate 78 is branched by the island-like walls 86 into branches, and these branches are joined again together on the FPC tape 70. Namely, the gate 18 once avoids the sprocket holes 82 by being branched, and the branches rejoin together on the FPC tape 70, so that the entire end face of the FPC tape 70 is used as the gate to improve the flow of the resin. The adoption of this gate 78 enables the filling of the resin for simultaneously forming a large number of semiconductor packages 10. Reference numeral 88 designates a cull.

Figure 28:
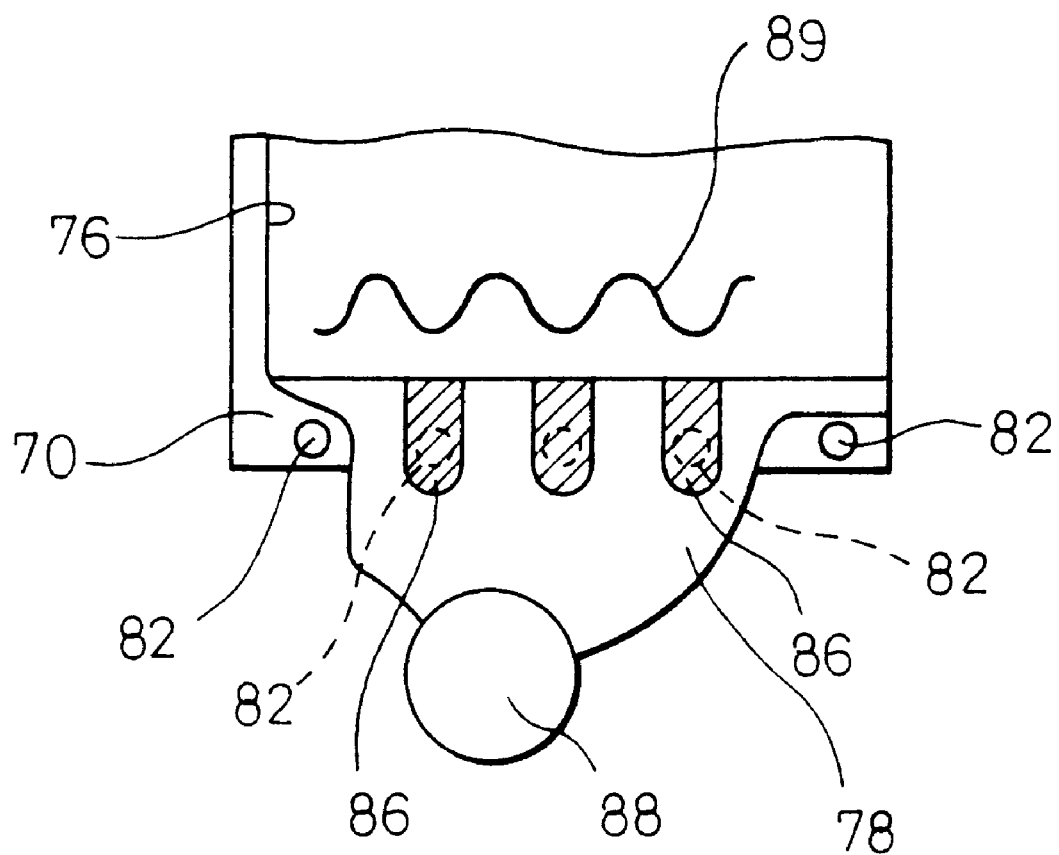
FIG. 28 is a view showing another example of a gate-side portion of a cavity used in the molding step.

FIG. 28 shows another example of the gate-side portion of the cavity 76 used in the molding step. This example is similar to the example illustrated in FIG. 27 except for the shape of each of the walls 86 covering the sprocket holes 82 in the gate 78. The upstream-side end portion of each of the walls 86 shown in FIG. 28 in the direction of a flow of the resin is rounded, and the walls 86 maintain the constant shape after they cover the corresponding sprocket holes 82 until the walls 86 reach the end surface of the FPC tape 70. Therefore, the area of the gate 78 is decreased at the open end portions of the walls 86. Thus, the flow of the resin occurs in the corrugated manner as indicated by reference numeral 89. Consequently, the filling ability of the resin is reduced. Hence, the constitution of FIG. 27 is preferable at the present time.

Figure 29:
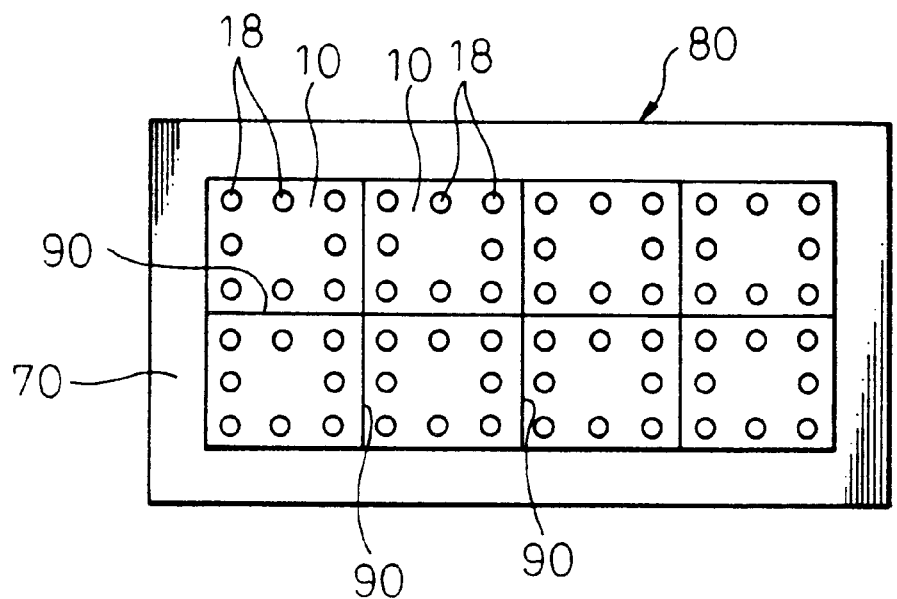
FIG. 29 is a view showing an example in which the molded product is cut after metal balls are attached to the molded product.
Figure 30:
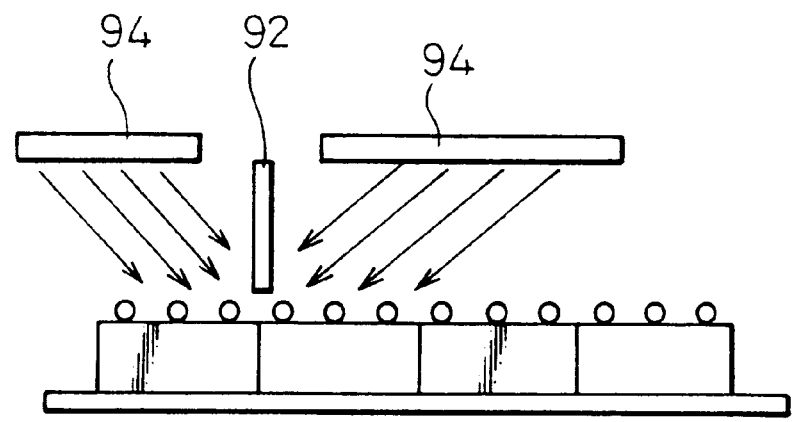
FIG. 30 is a view showing an example in which the molded product is cut.

FIGS. 29 and 30 show an example in which the molded product 80 is cut after the metal balls 18 are attached to the molded product 80. A dicer cuts the molded product 80 along cut lines 90 into individual semiconductor packages 10 by a blade 92 thereof. The dicer includes what is called a "shower device" 94. The shower device 94 is usually operative to spray water onto the blade 92. However, in this example, the shower device 94 is adapted to simultaneously spray water onto the surface of the semiconductor packages 10 containing the metal balls 18 and the blade 92. The water serves to aid the blade 92 in cutting the resin and to clean the metal balls 18.

Figures 31A, 31C:
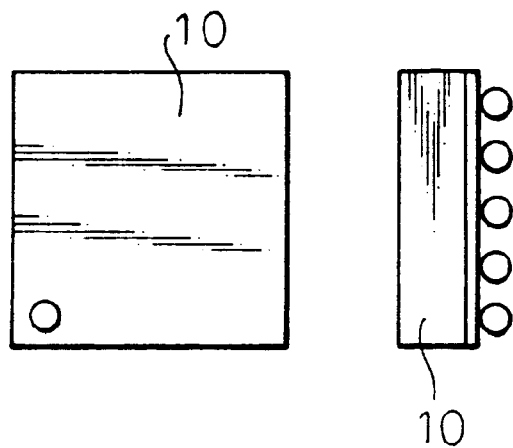
FIG. 31A is a plan view of the semiconductor package obtained by cutting the molded product.
FIG. 31C is a side view of the semiconductor package on the opposite side thereof.
Figure 31B:
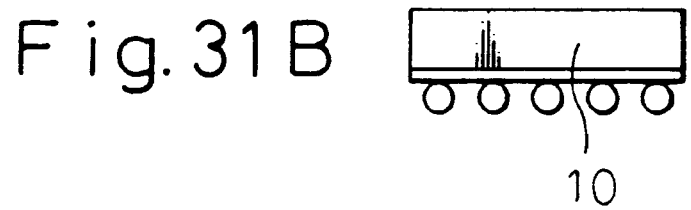
FIG. 31B is a side view of the semiconductor package.

The step after the step of attaching the metal balls 18 to for the usual FBGA process are the reflowing step, the cleaning step and the dicer cutting step. In this example, the cleaning step is omitted with the result of reducing the cost. An ordinary dicer cuts the resin by rotating the blade 92, so that the blade 92 produces heat. Thus, the blade 92 is cooled by water. In the case of this example, the cleaning of the metal balls 18 is performed by utilizing the sprayed water. As a result, it is sometimes necessary to change the number and the positions of the shower devices. To clean the metal balls 18 by water, a flux for the metal balls 18 should be water-soluble. FIGS. 31A to 31C show a semiconductor package 10 obtained by cutting the molded product 80. FIG. 31A is a plan view of the semiconductor package, FIG. 31B is a side view of the semiconductor package, and FIG. 31C is side view of the semiconductor package on the other side thereof. The side surface of the semiconductor package 10 is cut by the dicer and is perpendicular to the top and bottom surfaces of the package 10.

Figure 32:
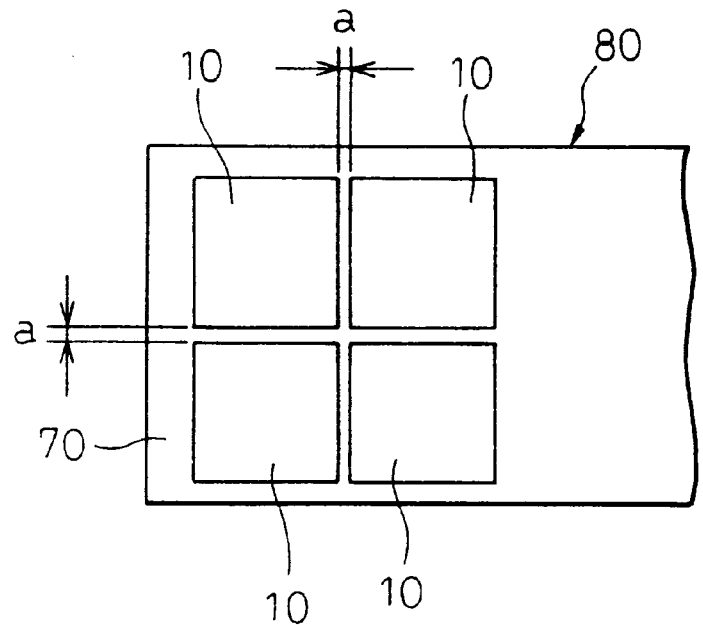
FIG. 32 is a view illustrating the feature of the molded product for cutting it to obtain the semiconductor package.

FIG. 32 illustrates the feature for cutting the molded product 80 from which the semiconductor package 10 is obtained. In this example, a cutting margin "a" left for cutting the molded product 80, from which the semiconductor package 10 is obtained, is 0.3 mm at the maximum. In other words, the molded product 80 is adapted so that the distance between the outer edges of adjacent two semiconductor packages 10 is a sum of the distance of 2 times the size of each of the semiconductor packages 10 to be formed and the dimension of a gap between the adjacent two semiconductor packages 10. The aforementioned dimension of the gap "a" is not more than 0.3 mm.

If the cutting margin is not more than 0.3 mm, the molded product 80 is cut by the blade 92 at one cutting operation and the dimension of the obtained semiconductor package 10 is within the allowable value. If the cutting margin is, for instance, 0.5 mm, the molded product 80 cannot be cut at one cutting operation by the blade 92 and, two or more attempts to cut the product 80 by the blade 92 are needed. As a result of setting the cutting margin at a value which is not more than 0.3 mm, the time required to cut the resin can be reduced, and the number of the extracted semiconductor packages 10 corresponding to the constant area of the cavity 78 can be maximized.

Figure 33:
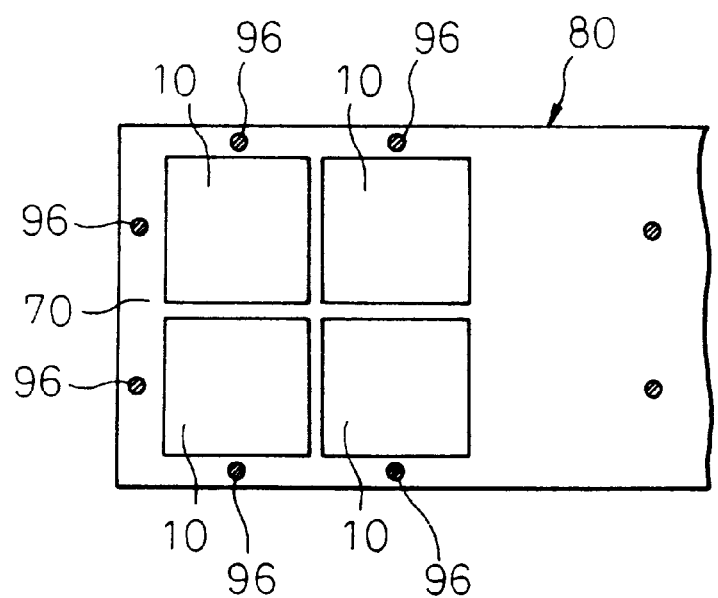
FIG. 33 is a view illustrating another feature of the molded product for cutting it to obtain the semiconductor package.

FIG. 33 illustrates another feature for cutting the molded product 80 from which the semiconductor package 10 is obtained. In this example, alignment marks 96 for cutting the molded product 80 into individual semiconductor packages 10 are provided on the molded product 80 in correspondence to each of the packages 10. Higher-precision cutting can be achieved by providing the identification alignment marks 96 for cutting the product 80 by the dicer.

Figure 34:
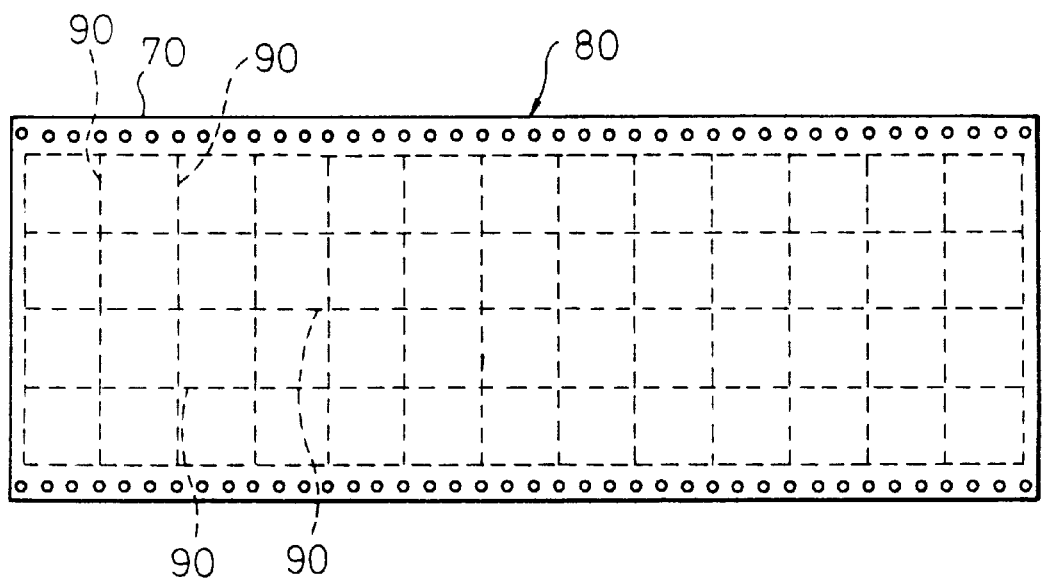
FIG. 34 is a view showing an example of the molded product.
Figure 35:
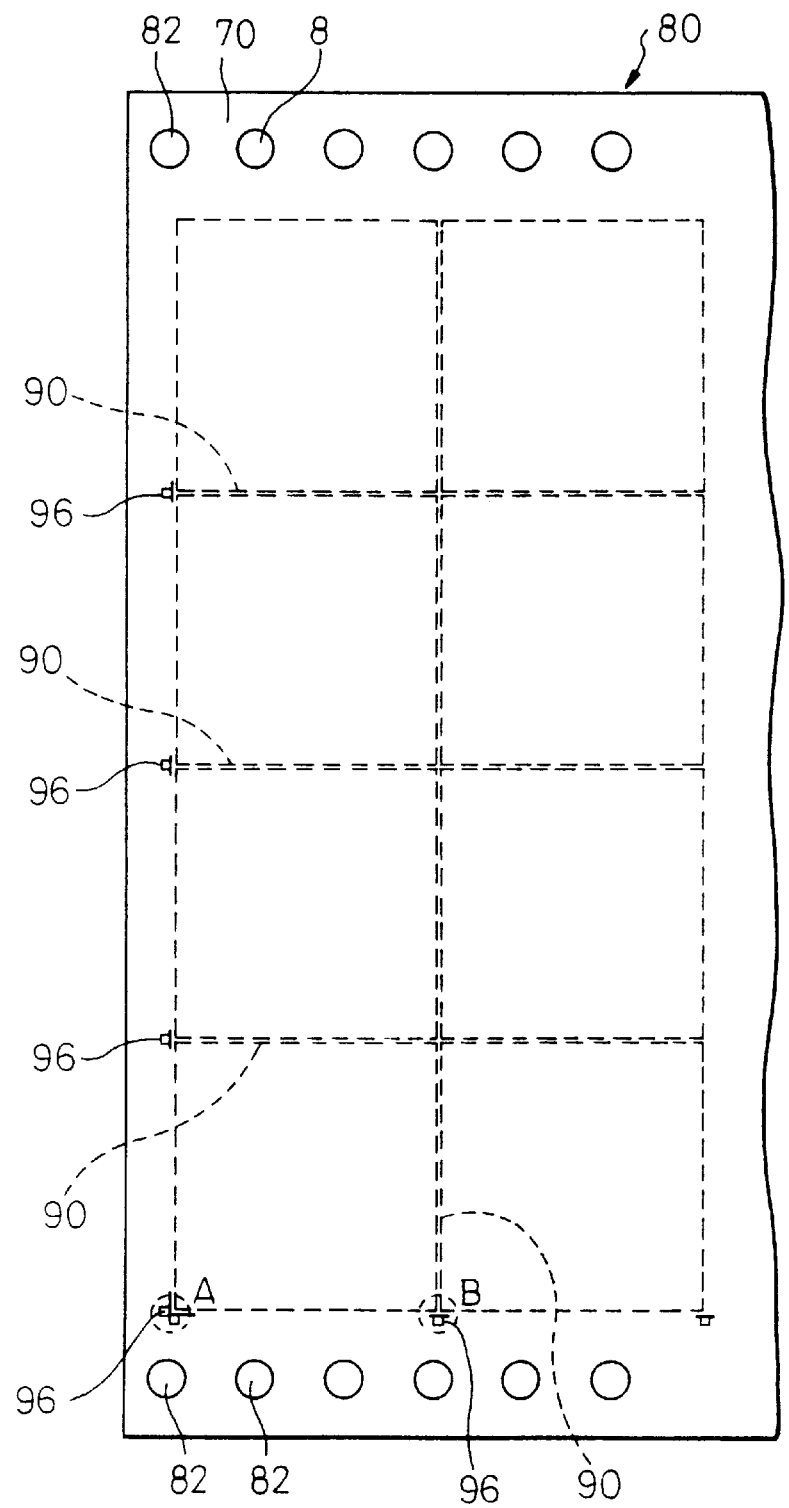
FIG. 35 is an enlarged view showing a part of the molded product of FIG. 34.
Figure 36:
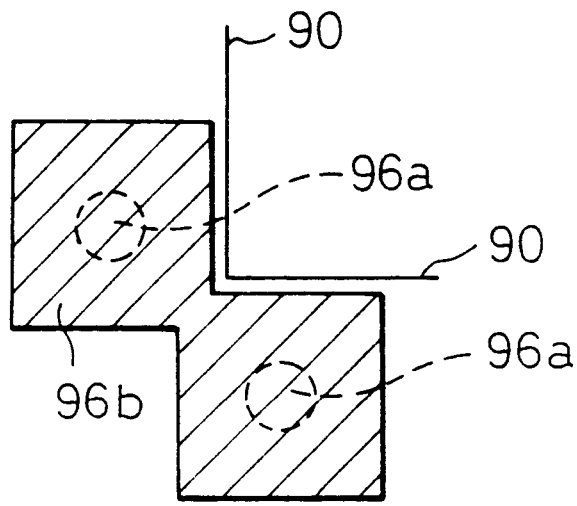
FIG. 36 is an enlarged view of an alignment mark indicated by a dashed circle A in FIG. 35.
Figure 37:
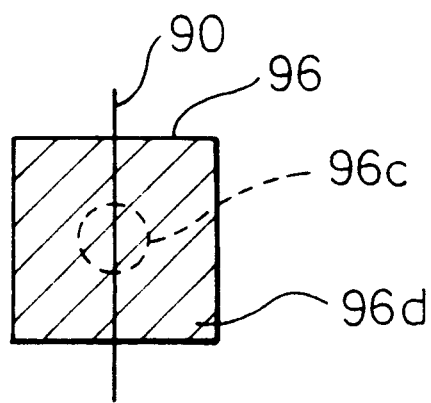
FIG. 37 is an enlarged view of an alignment mark indicated by a dashed circle B in FIG. 35.

FIG. 34 shows an example of the molded product 80. FIG. 35 is an enlarged view showing a part of the molded product 80 of FIG. 34. FIG. 36 is an enlarged view of an alignment mark indicated by a dashed circle A in FIG. 35. FIG. 37 is an enlarged view of an alignment mark indicated by a dashed circle B in FIG. 35. The alignment marks 96 are placed nearly on the cut line 90. This example also includes the feature described by reference to FIGS. 32 and 33.

The alignment mark 96 shown in FIG. 36 comprises a hole 96a, which is provided in the FPC tape 70, and a pattern 96b obtained by etching a copper layer provided on the FPC tape 70. This alignment mark 96 is placed at an intersection between two cut lines 90. Further, the alignment mark 96 shown in FIG. 37 comprises a hole 96c, which is provided in the FPC tape 70, and a pattern 96d obtained by etching a copper layer provided on the FPC tape 70.

In this manner, the alignment marks are provided so that both the identification based on the hole, which is provided in the FPC tape 70, and the identification based on the etching pattern can be performed. Thus, the identification of the package can be achieved by utilizing either the hole or the pattern, so that the cutting of the resin can be achieved with high accuracy. Further, the positional accuracy, with which the hole is provided in the FPC tape 70, is relatively low. Therefore, the accuracy of the identification can be enhanced by using the patterns 96b and 96d formed from the copper layer together with a circuit pattern.

Figure 38:
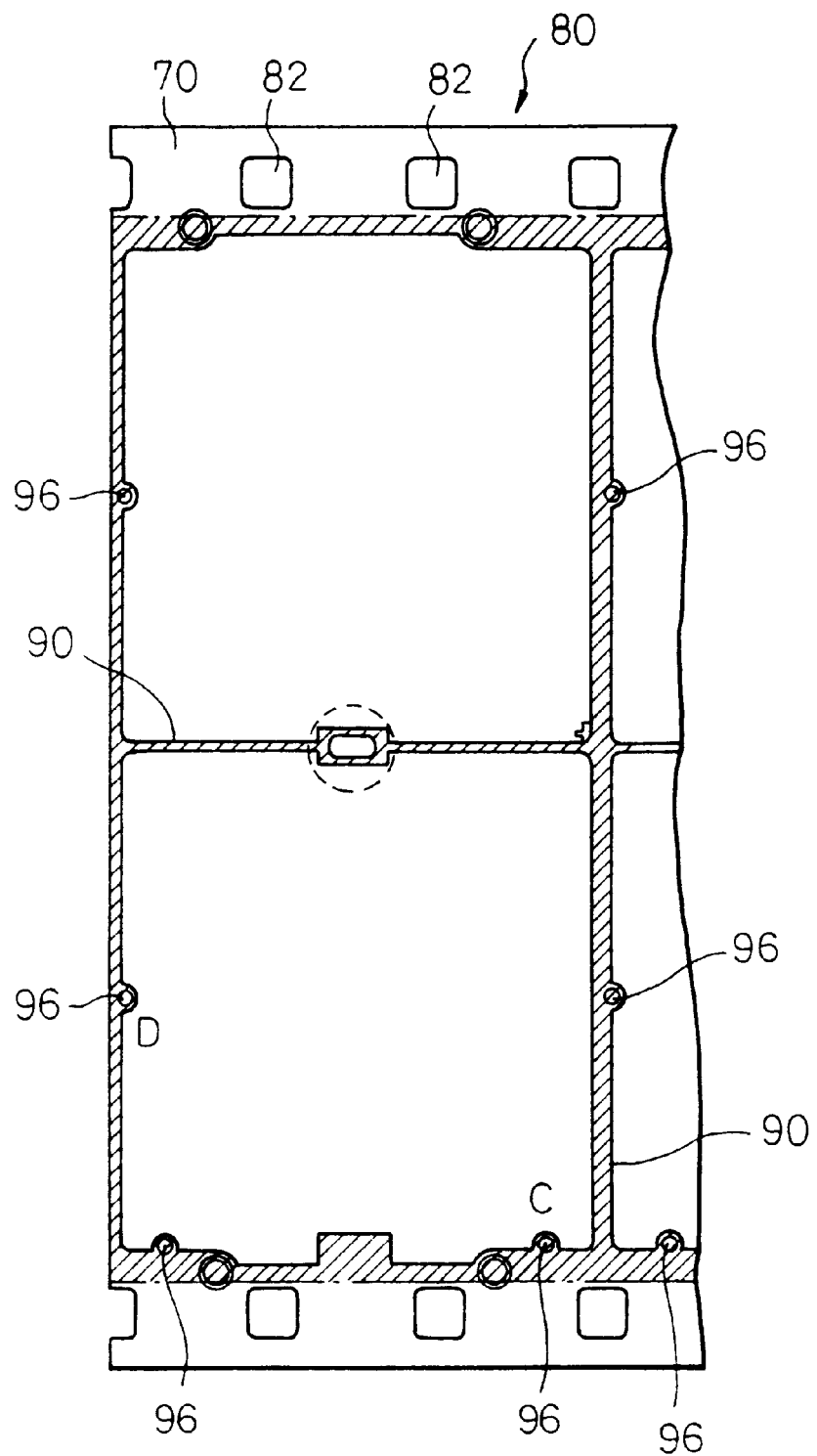
FIG. 38 is a view showing another example of the molded product.
Figure 39:
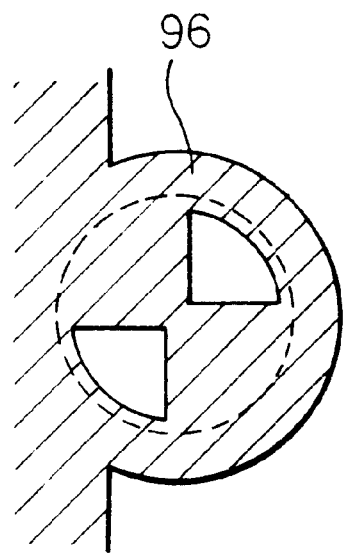
FIG. 39 is an enlarged view of an alignment mark indicated in FIG. 38.
Figure 40:
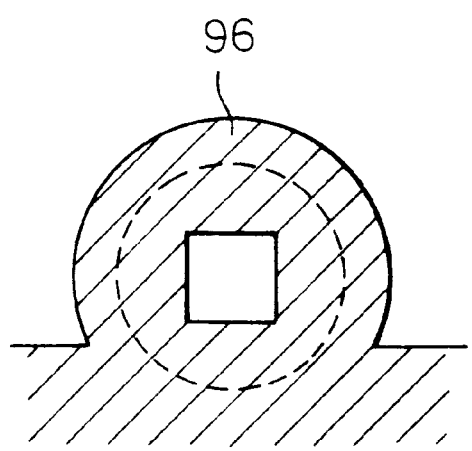
FIG. 40 is an enlarged view of another alignment mark indicated in FIG. 38.

FIG. 38 shows another example of the molded product 80. FIG. 39 is an enlarged view of an alignment mark indicated by a circle D in FIG. 38. FIG. 40 is an enlarged view of another alignment mark indicated by a circle C in FIG. 38. In this example, the two alignment marks 96 are placed at both sides of a single cut line 90 equidistant from the cut line 90. Copper linear patterns are provided along the peripheral portion and a part of the cut lines 90. Each of the alignment marks 96 comprises a corresponding hole provided in the FPC tape 70 and a corresponding pattern formed on a layer on the tape 70, as in the case of the aforementioned example.

Figure 41:
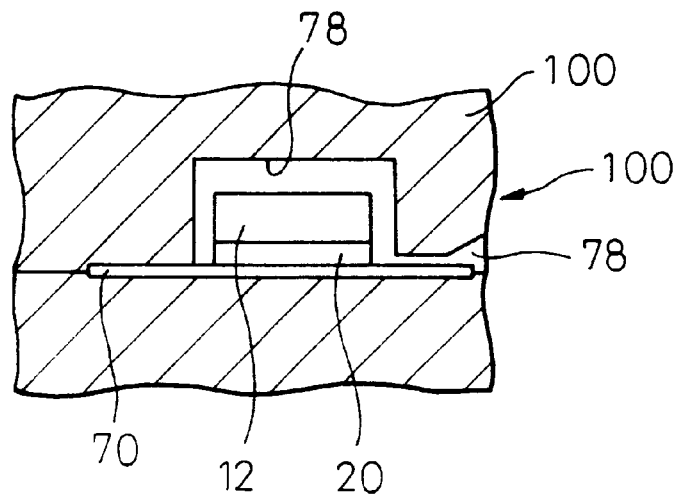
FIG. 41 is a cross-sectional view showing a molding die.

FIG. 41 is a cross-sectional view showing a molding die. The molding die 100 has an upper die 100U and a lower die 100L. The upper die 100U and the lower die 100L compose the cavity 78. This is a typical example of the molding die 100.

Figure 42:
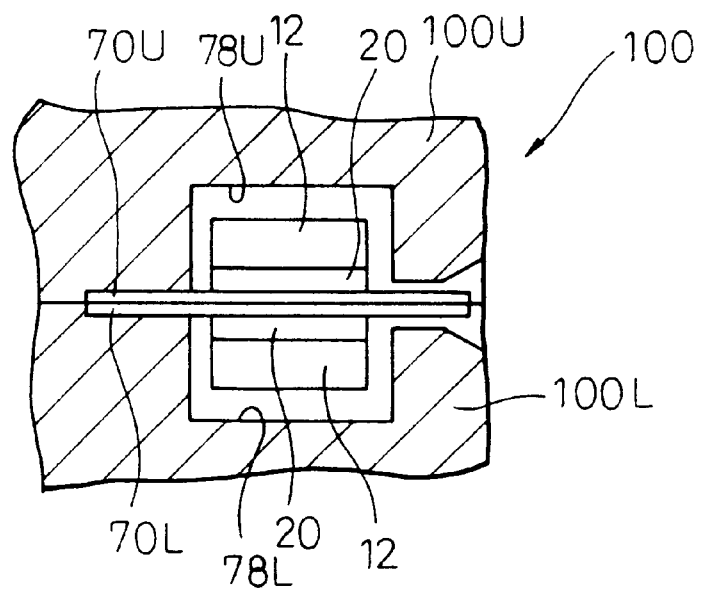
FIG. 42 is a cross-sectional view showing a molding die for concurrently placing two FPC tapes.

FIG. 42 is a cross-sectional view showing a molding die for concurrently placing two FPC tapes. A molding die 100 has an upper die 100U and a lower die 100L. The upper die 100U and the lower die 100L form cavities 78U and 78L, respectively. The cavities 78U and 78L are formed so that FPC tapes 70U and 70L are placed in the cavities 78U and 78L, respectively. Each of the FPC tapes 70U and 70L has a plurality of semiconductor chips 12 mounted thereto. In this way, a plurality of FPC tapes 70U and 70L, each of which contains a plurality of semiconductor chips 12, are set in a single molding die 100. Consequently, the efficiency in molding performed at the molding step can be enhanced.

Figure 43:
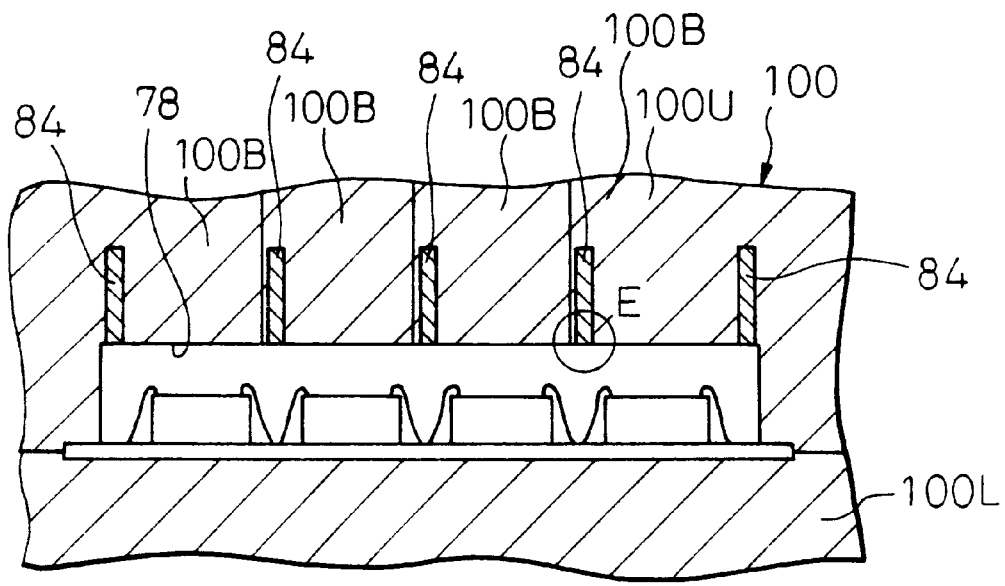
FIG. 43 is a cross-sectional view showing a molding die containing ejector pins.

FIG. 43 is a cross-sectional view showing a molding die containing ejector pins. A mold die 100 has an upper die 100U and a lower die 100L. The upper die 100U is formed of a plurality of blocks 100B each of which has ejector pins 84. There are several kinds of blocks 100B. The blocks 100B to be used can be selected according to the kind of the semiconductor chips 12. In the case of employing the method of collectively molding semiconductor chips by means of the molding die of this constitution for solving a problem concerning the separation of the dies, the limit to the cutting margin and the number of the extracted semiconductor packages are increased. The ejector pins 84 are provided in the central portion of the die as countermeasures against the problem caused when separating the dies to be used for collectively molding semiconductor chips.

Figure 44:
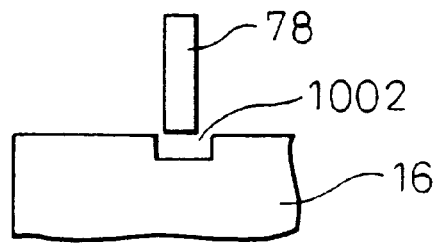
FIG. 44 is an enlarged view of a portion indicated by a circle E in FIG. 43.

FIG. 44 is an enlarged view of a portion indicated by a circle E in FIG. 43. A molding die is preliminarily constructed so that a depression 102 is formed in the mold resin 16 of the semiconductor package 10. The depression 1002 is used as a mark for cutting in the cutting step to be performed after the molding step. The depression 1002 is formed so that a cut line passes through the position of the ejector pin 84.

Figure 45:
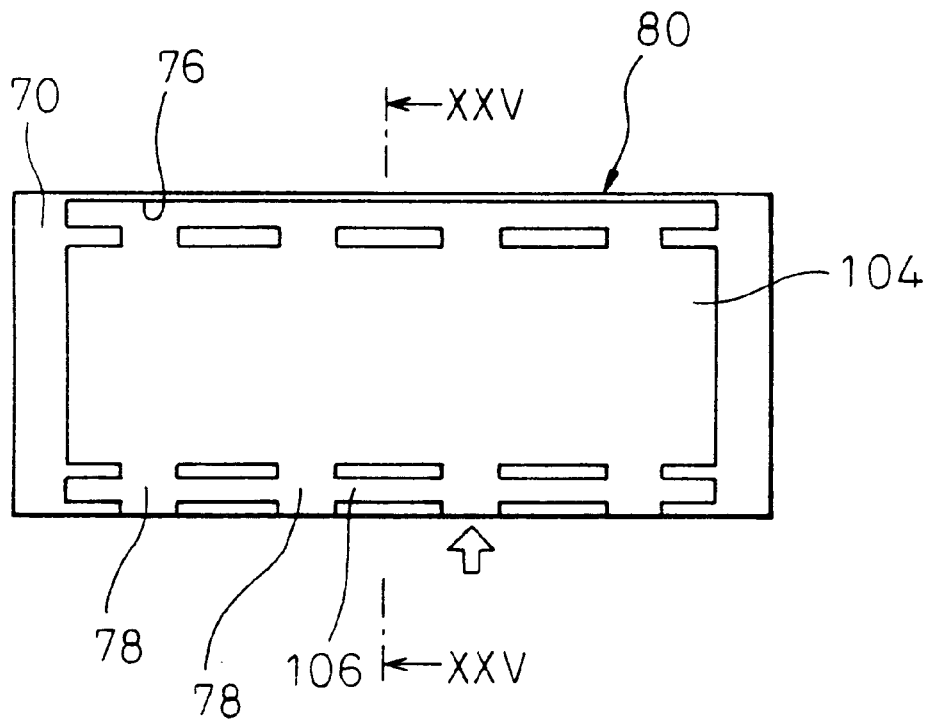
FIG. 45 is a cross-sectional view showing a molded product having a resin portion which is thicker than a molded portion.
Figure 46:
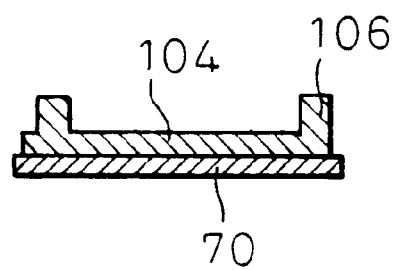
FIG. 46 is a cross-sectional view taken on the lines XXXXVI–XXXXVII in FIG. 45.

FIG. 45 is a cross-sectional view showing a molded product having a resin portion which is thicker than a molded portion. FIG. 46 is a cross-sectional view taken on the line XXXXVI–XXXXVII in FIG. 45. A molded product 80 has a plurality of semiconductor chips 12 (not shown in FIG. 45) mounted to the FPC tape 70, and are resin-molded in such a way as to cover the semiconductor chips 12. In FIG. 45, the side designated by the arrow is a gate-side. The opposite side is a bent-side.

A molded portion 104 is a mold resin portion covering the semiconductor chips 12. Resin portions 106 referred to herein are molded resin portions provided on the gate-side and the bent-side portions. The resin portions 106 are provided on both sides of the molded portion 104 and have no semiconductor chips 12. At the cutting step, the resin portions 106 are cut and thrown away. However, the resin portions 106 are formed in such a manner as to be thick in the longitudinal direction. Thus, the resin portions 106 impart considerable strength to the molded product 80. Consequently, the molded product 80 is hard to warp. Therefore, the molded product 80 can be fed through the production line.

Figure 47:
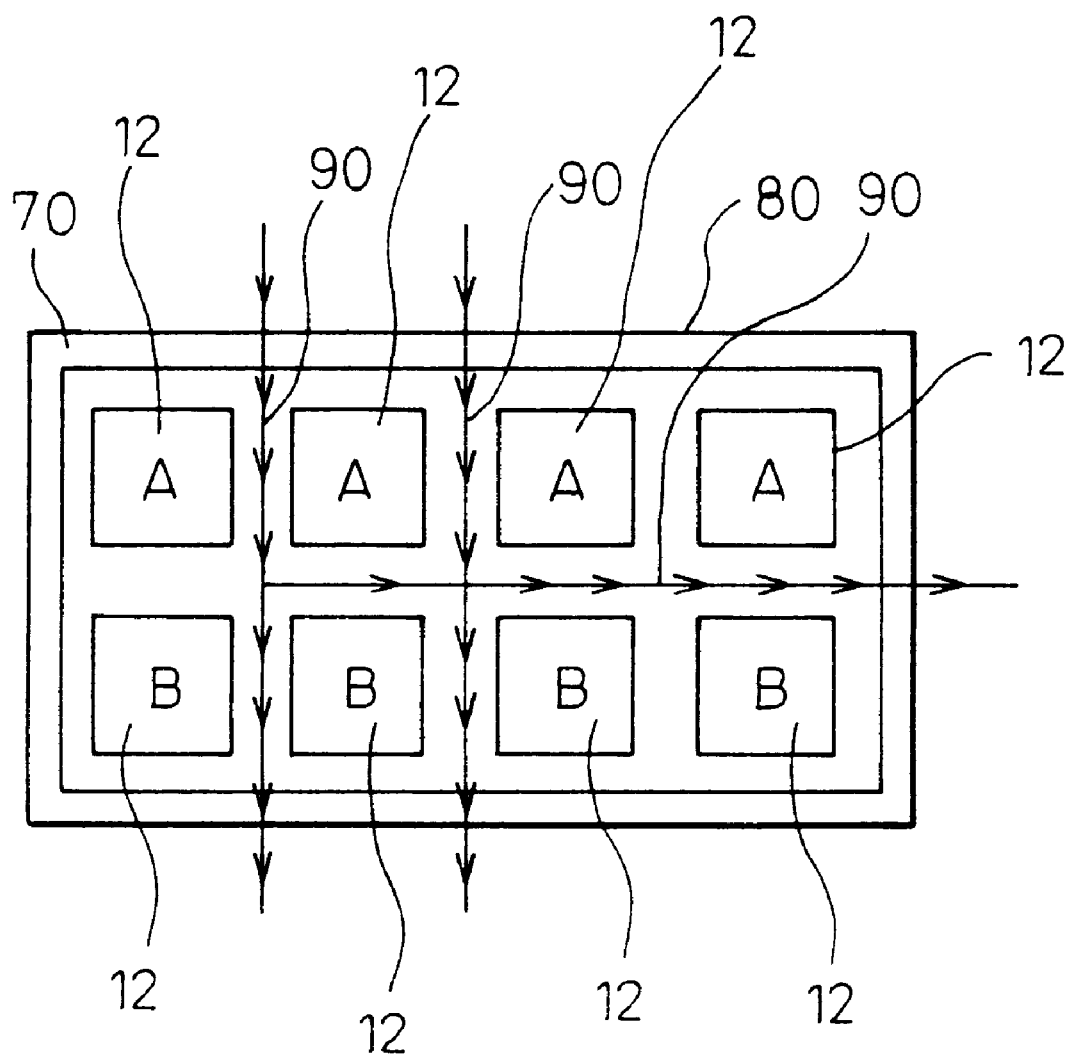
FIG. 47 is a view showing a molded product in which cut lines are changed.

FIG. 47 shows a molded product in which cut lines are changed. The molded product 80 includes two kinds of semiconductor chips 12, which are distinguished by reference characters A and B. Cut line 90 is not necessarily set in such a manner as to divide the molded product 80 into pieces each having only one semiconductor chip 12. Namely, the molded product 80 is cut so that a single semiconductor package 10 may contain a plurality of semiconductor chips 12. For instance, a certain semiconductor package 10 contains two kinds (A and B) of semiconductor chips 12. Further, another semiconductor package 10 contains two semiconductor chips 12 of the same kind (A or B). Thus, a semiconductor package 10, which is equivalent to MCM (Multi-Chip Module), can be obtained by collectively molding the chips and changing the manner of cutting the mold product.

What is claimed is:

1. A semiconductor device comprising a semiconductor chip; an FPC tape for mounting said semiconductor chip thereto, a mold resin for protecting said semiconductor chip, and metal balls provided on said FPC tape for connecting said semiconductor chip to a circuit board, said mold resin having a glass transition temperature not lower than 200° C., a coefficient of linear expansion in the range from 13 to 18 ppm/° C., and Young's modulus in the range from 1500 to 3000 kg/mm².

2. The semiconductor device according to claim 1, wherein said semiconductor device is a face-up wire-bonding type semiconductor package.

3. The semiconductor device according to claim 1, wherein said semiconductor device is a face-down flip chip type semiconductor package.

4. A semiconductor device comprising a package having a semiconductor chip, an FPC tape for mounting said semiconductor chip thereto, a mold resin for protecting said semiconductor chip, metal balls provided on said FPC tape, and a circuit board connected to said package by said metal ball, said mold resin having a glass transition temperature not lower than 200° C., a coefficient of linear expansion in the range from 13 to 18 ppm/° C., and Young's modulus in the range from 1500 to 3000 kg/mm².

5. A semiconductor device comprising a semiconductor chip, an FPC tape for mounting said semiconductor chip thereto, a mold resin for protecting said semiconductor chip, metal balls provided on said FPC tape for connecting said semiconductor chip to a circuit board, and buffer means for buffing stress exerted on said metal balls, said buffer means being arranged between said mold resin and said metal ball.

6. The semiconductor device according to claim 5, wherein said buffer means comprises a buffer layer provided on a surface of said FPC tape on the side where said semiconductor chip is mounted.

7. The semiconductor device according to claim 5, wherein said buffer means includes an air layer, said air layer being arranged at a position on an axis of said metal ball.

8. The semiconductor device according to claim 5, wherein said buffer means comprises a buffer layer provided on a surface of said FPC tape on the side opposite to the surface where said semiconductor chip is mounted.

9. A semiconductor device comprising a semiconductor chip having a top surface and a bottom surface, an FPC tape for mounting said semiconductor chip thereto, an adhesive agent, provided on the bottom surface of said semiconductor chip at a partial area thereof for fixing the bottom surface of said semiconductor chip to said FPC tape, a mold resin for protecting said semiconductor chip, and metal balls provided on said FPC tape, wherein said mold resin covers the top surface of said semiconductor chip and is inserted in a space between the bottom surface of said semiconductor chip and said FPC tape and around said adhesive agent.

10. The semiconductor device according to claim 9, wherein said mold resin has a glass transition temperature not lower than 200° C. and a coefficient of linear expansion in the range from 13 to 18 ppm/° C.

11. The semiconductor device according to claim 9, wherein said adhesive agent comprises a die bonding material.

12. The semiconductor device according to claim 9, wherein said adhesive comprises an underfill material.

13. The semiconductor device according to claim 9, wherein said adhesive comprises an anisotropic conductive material.

14. The semiconductor device according to claim 9, wherein said metal balls provided on said FPC tape are placed at positions outside an area on which said adhesive is placed.

15. The semiconductor device according to claim 11, wherein said die bonding material comprises a die bonding adhesive including spacers.

16. The semiconductor device according to claim 11, wherein said die bonding material comprises a die bonding tape.

* * * * *